US009798848B1

(12) United States Patent
Keshavan et al.

(10) Patent No.: US 9,798,848 B1
(45) Date of Patent: Oct. 24, 2017

(54) METHOD, SYSTEM, AND COMPUTER PROGRAM PRODUCT FOR PERFORMING CHANNEL ANALYSES FOR AN ELECTRONIC CIRCUIT DESIGN INCLUDING A PARALLEL INTERFACE

(71) Applicant: Cadence Design Systems, inc., San Jose, CA (US)

(72) Inventors: Kumar Chidhambara Keshavan, Medford, MA (US); Ambrish Kant Varma, Chelmsford, MA (US); Taranjit Singh Kukal, Delhi (IN); Rameet Pal, New Delhi (IN); Bradford Griffin, Londonderry, NH (US); Kenneth Robert Willis, Matthews, NC (US); Hui Qi, Shanghai (CN); Xuegang Zeng, Westborough, MA (US)

(73) Assignee: Cadence Design Systems, Inc., San Jose, CA (US)

(*) Notice: Subject to any disclaimer, the term of this patent is extended or adjusted under 35 U.S.C. 154(b) by 471 days.

(21) Appl. No.: 14/475,469

(22) Filed: Sep. 2, 2014

(51) Int. Cl.
*G06F 17/50* (2006.01)

(52) U.S. Cl.
CPC ................ *G06F 17/5081* (2013.01)

(58) Field of Classification Search
CPC ............ G06F 17/5036; G06F 17/5022; G06F 17/5031; G06F 17/5045; G06F 17/5077; G06F 2217/84; G06F 17/5027; G06F 17/505; G06F 17/5068; G06F 11/0748; G06F 11/2294; G06F 17/5054; G06F 2217/04

(Continued)

(56) References Cited

U.S. PATENT DOCUMENTS

| 8,453,102 B1* | 5/2013 | Pack .................... G06F 17/505 716/139 |
| 8,737,490 B1 | 5/2014 | Wilson et al. |
| 2011/0107252 A1* | 5/2011 | Balaram ............ G06F 17/5036 715/773 |

OTHER PUBLICATIONS

Yuan, F., "Chapter 4: Switching Noise", Department of Electrical & Computer Engineering, Ryerson University, Toronto, ON, Canada, dated Oct. 12, 2015 (22 pages).

(Continued)

*Primary Examiner* — Binh Tat
(74) *Attorney, Agent, or Firm* — Vista IP Law Group, LLP

(57) ABSTRACT

Disclosed are methods and systems for characterizing and analyzing an electronic system design including a parallel interface. Some methods and systems identify an electronic design including a parallel interface, determine a single circuit representation including the parallel interface from the electronic design, and analyze the parallel interface to determine waveform responses of the parallel interface by using channel analysis techniques without performing circuit simulations. Some other methods and systems are directed at performing channel analyses for a communication interface of an electronic system by concurrently applying stimuli to corresponding transmitters of a communication interface, characterizing the communication interface to perform a single simulation on the communication interface with the stimulus to determine responses at receivers of the communication interface, and determining waveform responses of the communication interface by performing operations on the responses and an input signal to the communication interface.

20 Claims, 16 Drawing Sheets

(58) Field of Classification Search
USPC .................................. 716/100–106, 136–139
See application file for complete search history.

(56) References Cited

OTHER PUBLICATIONS

Yuan, F., "Simultaneous Switching Noise (SSN)", Department of Electrical & Computer Engineering, Ryerson University, Toronto, ON, Canada, 2011 (50 pages).

Chen, Z., et al., "A New Approach to Deriving Packaging System Statistical Eye Diagram Based on Parallel Non-Linear Transient Simulations Using Multiple Short Signal Bit Patterns", IBM Corporation, IEEE, 2012 (8 pages).

Zhou, X., et al., "Steady-State Analysis of Nonlinear Circuits Using Discrete Singular Convolution Method", ECE Dept., University of Texas at Dallas, Richardson, TX, IEEE, 2004 (5 pages).

"Understanding and Minimizing Ground Bounce", Fairchild Semiconductor Application Note, dated Jun. 1989 (16 pages).

"S-Parameter Simulation", Agilent Technologies, Aug. 2005 (32 pages).

"Cross-SSN analysis in multilayer Printed Circuit Boards", Computer Simulation Technology, 2014 (2 pages).

Heydari, P., et al., "Analysis and Optimization of Power/Ground Bounce in Digital CMOS Circuits", Department of Electrical Engineering-Systems, University of Southern California, ICCD 2000 (15 pages).

Heydari, Payam, and Massoud Pedram. "Analysis and optimization of ground bounce in digital CMOS circuits." Computer Design, 2000. Proceedings. 2000 International Conference on. IEEE, 2000.

"Simultaneous Switching Noise (SSN) Analysis and Optimizations", Quartus II Handbook Version 13.1 vol. 2: Design Implementation and Optimization, Jun. 2012 (20 pages).

Shan, L., et al., "Packaging Considerations for High-Speed Single-ended and Differential Nets", T. J. Watson Research Center, IBM Corp., IEEE, 2006 (5 pages).

Chen, R., et al., "Fundamentals of S S-Parameter Modeling for Power Distribution System (PDS) and SSO Analysis", IBIS Summit, Jun. 2005 (26 pages).

SystemSI—Parallel Buss Analysis, 2011 (2 pages).
SystemSI—Serial Link Analysis, 2011 (2 pages).

\* cited by examiner

METHOD, SYSTEM, AND COMPUTER PROGRAM PRODUCT FOR PERFORMING CHANNEL ANALYSES FOR AN ELECTRONIC CIRCUIT DESIGN INCLUDING A PARALLEL INTERFACE

BACKGROUND

The recent advances in very deep sub-micron (VDSM) integrated circuits (ICs) have brought new challenges in the design methodology process of electronic circuit designs. In modern electronic circuits, geometries become smaller; clock frequencies increase; and on-chip interconnections gain increased importance in the prediction of performance. Signal integrity has become increasingly important. Meanwhile, increased power demand on ever shrunk chip size as well as the inadequacy of the ideal power assumption in conventional analyses further exacerbates the design challenges. Analysis capabilities such as various analyses and/or measurements from an eye diagram or eye pattern and bit error rate (BER) measurements (e.g., eye amplitude, eye crossing amplitude, eye crossing percentage, eye signal-to-noise ratio, quality factor, vertical eye opening, eye height, eye level, etc.) that account for adverse impacts on signal integrity, circuit performance, timing, etc. from, for example, intersymbol interferences (ISI), simultaneous switching noise (SSN) have become increasingly important, especially during the early design stages of electronic systems.

For computer buses such as the 64-bit or the 128-bit double data rate (DDR) bus, all 64 bits for the 64-bit DDR5 bus (or 128 bits for the 128-bit DDR3 bus) would switch simultaneously and thus draw a tremendous amount of current from the power rails and hence cause ripple in the power supply and noise in the net of the bus architecture as well as other victim nets. Comprehensive analysis techniques such as channel analysis have been developed but are primarily limited to serial interfaces (e.g., the universal serial bus or USB, serial advanced technology attachment or SATA bus, peripheral component interface express or PCIe, etc.) On the other hand, parallel interfaces such as the DDR (double data rate) nth-generation synchronous dynamic random-access memory buses (e.g., DDR3, DDR4, etc.) or QDR (quad data rate) buses have been analyzed with the time consuming general circuit simulation techniques such as SPICE or SPICE-like simulations, perhaps due to the non-linearity of the buffers in these parallel interfaces. With the advent of Gigabit range transfers per second (e.g., Gigatransfers per second or GT/s) and significant increase in bandwidth such as 128-bit wide, 192-bit wide, 256-bit wide buses, such general circuit simulation techniques are impractical at best, while being severely limited in the simulation throughout in the number of bits to tens of thousands of bits or low hundreds of thousands of bits at best.

Therefore, there exists a need for characterizing an electronic system design including a parallel interface and analyzing the characterized the electronic system design by using channel analysis techniques.

SUMMARY

Disclosed are method(s), system(s), and article(s) of manufacture for characterizing an electronic system design including a parallel interface and analyzing the characterized the electronic system design by using channel analysis techniques in various embodiments.

Some embodiments are directed at a method for characterizing an electronic system design including a parallel interface and analyzing the characterized the electronic system design by using channel analysis techniques. In these embodiments, the method may identify an electronic design including a parallel interface, determine a single circuit representation including the parallel interface from the electronic design, and analyze the parallel interface of the single circuit representation by using at least one processor or processor core of a computing system to determine waveform responses of the parallel interface of the single circuit representation by using channel analysis techniques. In analyzing the parallel interface, the method may further characterize the parallel interface of the single circuit representation to determine a characterized parallel interface, and perform a channel analysis on at least the parallel interface by using at least the channel analysis techniques.

In addition or in the alternative, the method may identify a first transmitter of a number of transmitters of the parallel interface, apply a first stimulus to the first transmitter of the number of transmitters while keeping remaining one or more transmitters silent, and determine first responses to the first stimulus at a number of receivers of the parallel interface by at least performing a circuit simulation for the single circuit representation. In some of these embodiments, the method may characterize the parallel interface by further performing the process of applying the first stimulus or another stimulus to each transmitter of the remaining one or more transmitters and the process of determining responses to the first stimulus or the another stimulus at the number of receivers of the parallel interface by at least performing the circuit simulation for the single circuit representation. In some embodiments, the first stimulus may comprise a step input or an impulse input, and the first responses may comprise a step response or an impulse response observed or determined at the number of receivers of the parallel interface.

The first responses may comprise at least one dominant contribution observed at a receiver corresponding to the first transmitter and cross-talk effects on remaining one or more receivers of the parallel interface in some embodiments. In performing the channel analysis on at least the parallel interface, the method may identify an input signal to the parallel interface of the single circuit representation, identify responses to stimuli at a number of receivers of the characterized parallel interface, and determine waveform responses of the parallel interface by convolving the responses observed at the number of receivers in the characterized parallel interface with the input signal, without performing electrical or functional circuit simulations in some embodiments. In some of these embodiments, the input signal may comprise an input bit stream, the characterized parallel interface may be determined by at least one or more simulations performed on a general purpose circuit simulator, and the one or more simulations may be performed in a time domain.

Some embodiments are directed at a method for performing channel analyses for a communication interface of an electronic system. In some of these embodiments, the method may concurrently apply a number of stimuli to a number of transmitters of a communication interface in a single circuit representation of an electronic design, characterize the communication interface by using at least one processor or processor core executing one or more threads to perform a single simulation on the communication interface with the stimulus to determine responses at a number of receivers of the communication interface, and determine waveform responses of the communication interface by performing operations on the responses and an input signal to the communication interface.

In addition, the method may further determine the single circuit representation from the electronic design, wherein the electronic design includes the communication interface, and the communication interface comprises the number of transmitters and the number of receivers in some of these embodiments. In addition or in the alternative, the number of stimuli may comprise a step input or an impulse input applied at a transmitter of the number of transmitters, and the a first response of the responses determined at a first receiver of the number of receivers may comprise dominant contribution of a first stimulus of the number of stimuli applied at a first transmitter corresponding to the first receiver and cross-talk effects of remaining one or more stimuli of the number of stimuli applied at remaining one or more transmitters of the number of transmitters other than the first transmitter.

The method may further optionally perform transmitter equalization prior to determining the responses at a number of receivers of the communication interface, provide the responses after the transmitter equalization and the input signal to a channel analysis module, and perform the operations by applying convolution to the responses determined at the number of receivers and the input signal for the communication interface. In addition or in the alternative, the method may also perform equalization on the waveform responses of the communication interface, and perform one or more analyses for the electronic design using at least the waveform response. In some of these embodiments, the one or more analyses include at least one of an analysis based on an eye pattern, one or more measurements based on the eye pattern, one or more bit error rate measurements, a signal integrity analysis, an intersymbol interference analysis, a simultaneous switching noise analysis.

Some embodiments are directed at a hardware module or system that may be invoked to perform any of the methods, processes, or sub-processes disclosed herein. The hardware system may include one or more variants of SPICE simulation engines, integration modules, model order reduction modules, various transforms, various matrix decomposition modules, various matrix factorization modules, one or more IBIS (input/output buffer information specification) modules, one or more s-parameter (scattering-parameter) modules, or one or more numerical modules, etc. in some embodiments. The hardware system may further include one or more forms of non-transitory machine-readable storage media or devices to temporarily or persistently store various types of data or information such as various IBIS or s-parameter models, extracted electronic circuit representations, various libraries, or any other suitable information or data, etc. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for characterizing an electronic system design including a parallel interface and analyzing the characterized the electronic system design by using channel analysis techniques are described below with reference to FIGS. 1-9.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
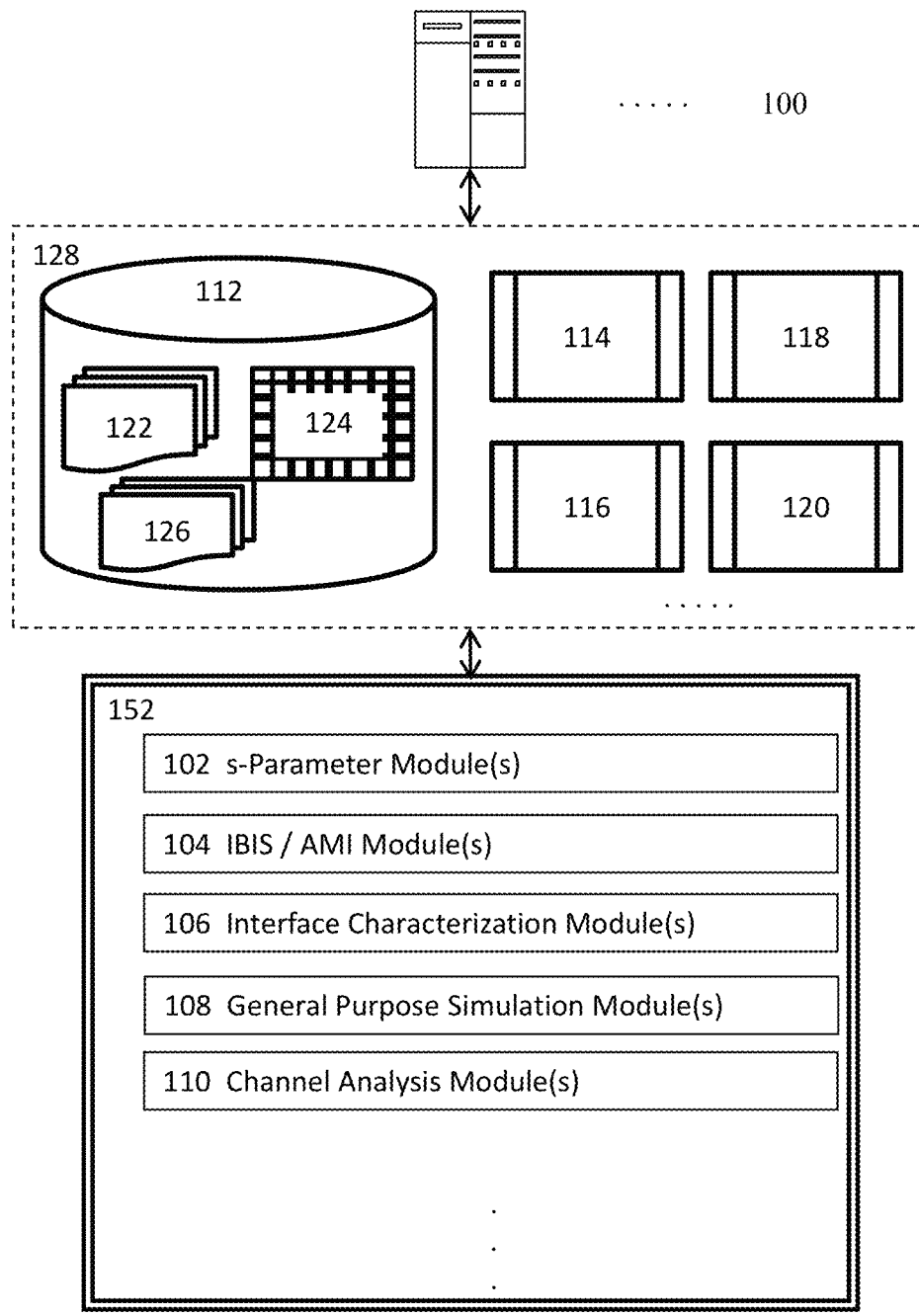
FIG. 1 illustrate a illustrative high level schematic block diagrams for a system for characterizing an electronic system design including a parallel interface and analyzing the characterized the electronic system design by using channel analysis techniques in some embodiments.

Various embodiments of the invention are directed to a methods, systems, and articles of manufacture for implementing thermal circuit extraction for transient thermal analyses. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Some embodiments are directed at methods, systems, and articles of manufacture for characterizing and analyzing an electronic system design including a parallel interface. In some of these embodiments, the method or system applies an input stimulus to each of a number of transmitters of at least one parallel interface, determines the responses to the input stimulus at each of a number of receivers by performing a circuit simulation in a time domain on a general purpose circuit simulator, and determines the waveform responses of the at least one parallel interface with respect to input signals by using channel analysis techniques, without performing circuit simulations or conventional time-stepping or domain discretizing simulations. In these embodiments, the method or system may analyze a parallel interface by characterizing the parallel interface to determine the responses to input stimuli at the receivers of the parallel interface and further by determining the waveform responses of the parallel interface by performing channel analysis, rather than performing general purpose circuit simulations or conventional time-stepping or domain discretizing simulation to obtain the waveform response of the parallel interface.

Some other embodiments are directed at methods, systems, and articles of manufacture for performing channel analyses for a communication interface of an electronic system. In these embodiments, the method or system applies an input stimulus to each of a number of transmitters of a circuit design model including at least one parallel interface and one serial interface, determines the responses to the input stimulus at each of a number of receivers of the parallel interface and the receiver of the serial interface by performing a single circuit simulation, instead of multiple circuit simulations, in a time domain on a general purpose circuit simulator, and determines the waveform responses of the circuit design model with respect to input signals by using channel analysis techniques on the responses to the input stimulus at the receivers of the parallel interface and the serial interface, without performing circuit simulations or conventional time-stepping or domain discretizing simulations. In these embodiments, the method or system may analyze the interactions such as the simultaneous switching noise, the intersymbol interferences, etc. between the parallel interface and the serial interface by characterizing the parallel and serial interfaces to determine their responses to input stimuli and determining the waveform responses of the circuit design model by channel analysis without performing simulations to obtain the waveform responses to input signals for the circuit design model including the parallel and serial interfaces.

FIG. 1 illustrate a illustrative high level schematic block diagrams for a implementing thermal circuit extraction for transient thermal analyses in some embodiments. In one or more embodiments, the system for FIG. 1 illustrate a illustrative high level schematic block diagrams for implementing thermal circuit extraction for transient thermal analyses may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), various data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises one or more S-parameter modules 102 to define an s-parameter (scattering parameters) model with signal-wave responses of an n-port electrical element at a frequency, one or more IBIS (input/output buffer information specification) modules 104 for serialization and deserialization modeling of electronic devices, one or more electronic interface characterization modules 106 (e.g., one or more electrical simulation modules) to characterize an electronic design model, one or more general purpose circuit simulation modules 108 (e.g., one or more variants of SPICE—Simulation Program with Integrated Circuit Emphasis—simulators), one or more channel analysis modules 110 for performing channel analysis to obtain wave responses of electronic systems without performing steady-state or transient simulations, etc. The one or more channel analysis modules 110 may further include at least one convolution module for performing convolution of the characterization results of an electronic system with the input stream.

Figure 2:
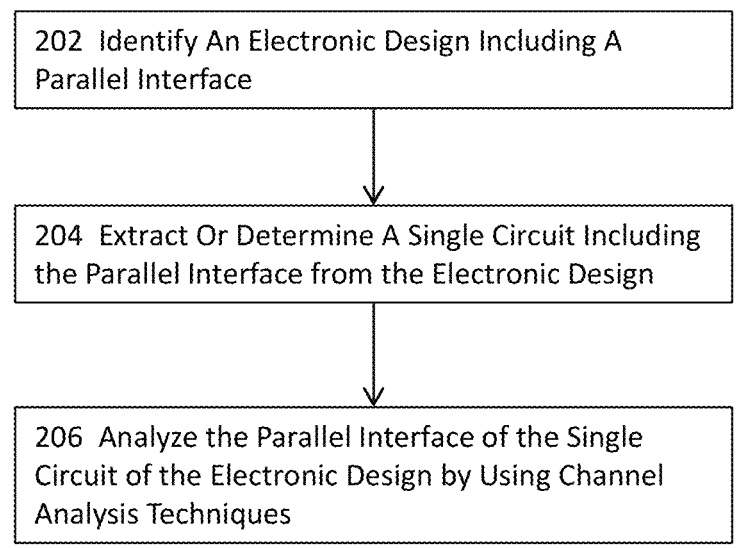
FIG. 2 illustrates a high-level block diagram for characterizing an electronic system design including a parallel interface and analyzing the characterized the electronic system design by using channel analysis techniques in some embodiments.

FIG. 2 illustrates a high-level block diagram for analyzing an electronic system design including at least one parallel interface using channel analysis techniques in some embodiments. In these embodiments illustrated in FIG. 2, the method or system may identify an electronic design that includes a parallel interface at 202.

A parallel interface may include a parallel communication bus or channel that conveys multiple binary digits (bits) simultaneously. A parallel interface contrasts with a serial communication interface or a serial interface which conveys a single bit at a time. A parallel interface may include multiple electrical conductors for conveying binary digits, as opposed to a single electrical conductor of a serial interface. For example, a 128-bit parallel interface conveys 128 binary digits simultaneously, whereas a serial interface conveys one binary digit at a time. A parallel interface may also include one or more additional electrical conductors for other signals including clock signals, control signals, and/or handshaking signals.

The term "interface" such as "parallel interface" or "serial interface" may be used interchangeably with "bus", "port", or "channel" in this application. In some of these embodiments, the electronic design may also include one or more serial interfaces communicably or operatively coupled to the at least one parallel interface. For example, the electronic design may include a mainboard of a computing system including a parallel interface such as a DDR4 bus (DDR fourth-generation synchronous dynamic random-access memory bus) and a serial interface such as an SATA bus and a PCIe bus that are communicably or operatively coupled to the parallel interface.

Two interfaces or even two interconnects are communicably or operatively coupled to each other if the operations of one interconnect have an impact on the other interconnect. For example, two interconnects or two interfaces are communicably or operatively coupled to each other if the signals on one may interfere with the signals on the other. As another example, two interconnects or interfaces are communicably or operatively coupled to each other if they are operatively coupled together to achieve their respective intended purposes.

At 204, the method or system may extract or determine a single circuit model including the parallel interface from the electronic design. The single circuit model of the electronic design may be extracted or determined at various abstraction levels. For example, the single circuit model extracted or determined at 204 may include an IBIS model or an IBIS-AMI (Input/put buffer information specification-algorithmic modeling interface) model including various models provided by, for example, one or more intellectual property vendors in some embodiments. The single circuit design model may also include an S-parameter model describing the electrical or functional behavior of an electronic device when undergoing various stimuli by electrical signals. An S-parameter model generally describes the electrical behavior or signal-wave responses of a linear electrical network.

For an electrical design including non-linear devices, the corresponding S-parameter may be obtained by performing DC (direct current) simulations and DC bias simulation to linearize the non-linear devices about the bias points. An IBIS model may include information about the input/output (I/O) buffers of an electronic design without revealing the intellectual property of the implementation of the electronic design and without an encryption key. An IBIS model may be used for various board or system level signal integrity simulations and/or timing analyses. In some embodiments, the single circuit model may even include an IBIS-AMI model for serialization and deserialization or serializer/deserializer (SerDes) channel simulations or time-domain channel simulations with a SerDes channel simulator, instead of a SPICE or SPICE-like simulator.

In some other embodiments, the single circuit of the electronic design may also include a design that may be used for input into subsequent modules. For example, a single circuit may include the netlist or a portion thereof of the electronic design that may be used in a subsequent SPICE or SPICE-like simulation module. As another example, the single circuit design model may include an IBIS-AMI model that may be used in a SerDes channel simulator to determine time-domain signal integrity analyses, time-domain channel simulations, and/or timing analyses. The netlist or the portion thereof may include the nets that are communicably or operatively coupled to each other. For example, the netlist or the portion thereof may include the parallel bus and the serial bus or other nets that are communicably or operatively coupled to each other.

At 206, the method or system may analyze the parallel interface of the electronic design. In some of these embodiments, the method or system may analyze various effects of the parallel interface on the remaining part of the single circuit design or the effects of the remaining part of the single circuit design on the parallel interface. For example, the method or system may analyze the single circuit design having the simultaneously switching parallel bus and determine the impact of the simultaneously switching parallel bus on the single circuit. As another example, the method or system may also analyze the single circuit design to determine the waveforms of the system's responses to input signals and analyze the system for one or more factors that may affect signal integrity and/or mitigate some of these one or more factors affecting the signal integrity in some embodiments.

In some of these embodiments, the one or more factors may include simultaneous switching noise, intersymbol interferences, bit error rate, distortion, etc. at various levels of the single circuit design such as the internal interconnections within a die, through the IC packaging, the printed circuit board, the back plane, and/or inter-system connections. In some of these embodiments, the method or system may analyze the single circuit design in two stages. During the first stage, the method or system may characterize the single circuit design to determine, for example, the waveforms for the system's responses to a step input or an impulse input stimulus in some embodiments. In some of these embodiments, the method or system may apply the step or impulse input as an input to a transmitter (e.g., a bus transmitter module) of a communication interface, and perform a general purpose circuit simulation to determine the waveform response to the step or impulse input stimulus at the receivers (e.g., bus receiver modules) by using a circuit simulator (e.g., a SPICE or SPICE-like simulator or a SerDes simulator).

It shall be noted that although the communication system may include only one receiver corresponding to the transmitter receiving the input stimulus, the other receivers are also analyzed to determine the coupling effects of the transmitter on the other receivers. In some these embodiments where the communication interface includes N transmitters and N receivers, the method or system may thus perform N× N characterizations. In some other embodiments, the method or system may apply the same step or impulse input stimulus to all transmitters of a communication interface (e.g., a DDRx bus) and determine the waveforms of the electronic system's responses to the step or impulse input stimulus at each of the receivers of the communication interface. In these embodiments, the method or system may characterize the simultaneous switching effects of the communication interface by applying the same input stimulus to the transmitters.

For example, the method or system may determine the waveform response at the receivers of the communication interface by applying the same stimulus to some or all of the transmitters of the communication interface to determine the simultaneous switching effects of these some or all transmitters. During the second stage, the method or system may identify the waveform responses at the receivers and convolve these waveforms with an input bit stream to determine the communication interface's waveform responses to the input bit stream of the communication interface, without having to perform any circuit simulations (e.g., SPICE or SPICE-like simulations with a SPICE or SPICE-like simulator or channel simulations with a SerDes simulator) and regardless of whether the communication interface is serial or parallel.

Convolution includes a series of mathematical operations performed on two signals (e.g., the step or impulse responses and the input signal). Generally, convolution comprises multiplying one of the two signals by a delayed or shifted version of the other signal of the two signals, integrating or averaging the product, and repeating these processes for one or more different delays. In some embodiments where the electronic design identified at 202 includes a serial interface and a parallel interface, the method or system may extract a single circuit design include both the serial and parallel interfaces at 204. The method or system may then convolve the waveform responses at the receivers of the single circuit design with an input bit stream to determine the single circuit design's waveform responses to the input bit stream. The single circuit design's waveform responses may then be used for various other analyses including, for example, eye diagram, bit error rate, intersymbol interferences, simultaneous switching noise, or other signal integrity analyses. In this example, the method or system may then analyze the serial interface in light of the parallel interface as well as the effects of the serial interface on the parallel interface.

One of the advantages provided by various embodiments described herein is the use of channel analysis techniques in analyzing or simulating a parallel interface. Some of the described embodiments use characterization techniques and channel analysis techniques in concurrently analyzing one or more parallel interfaces and one or more serial interfaces to dynamically capture the impact of the one or more parallel interfaces on the one or more serial interfaces or the impact of the one or more serial interfaces on the one or more parallel interfaces, all with one single simulation or analysis with a single circuit design model incorporating both the one or more serial interfaces and the one or more parallel interfaces. For example, these embodiments may concurrently analyze or simulate a circuit design model including both a parallel interface and a serial interface to determine the impact of, for example, simultaneously switching noise or intersymbol interferences of the parallel interface on the serial interface.

Another advantage of at least some of the described embodiments is that these embodiments provide great scalability for large-scale circuit designs including large numbers of transmitters and receivers by performing a limited number of characterizations or even a single characterization for any given circuit design and subsequently analyzing these large-scale circuit designs with the channel analysis techniques, without having to perform any general purpose simulations as the conventional approaches do.

Figure 2A:
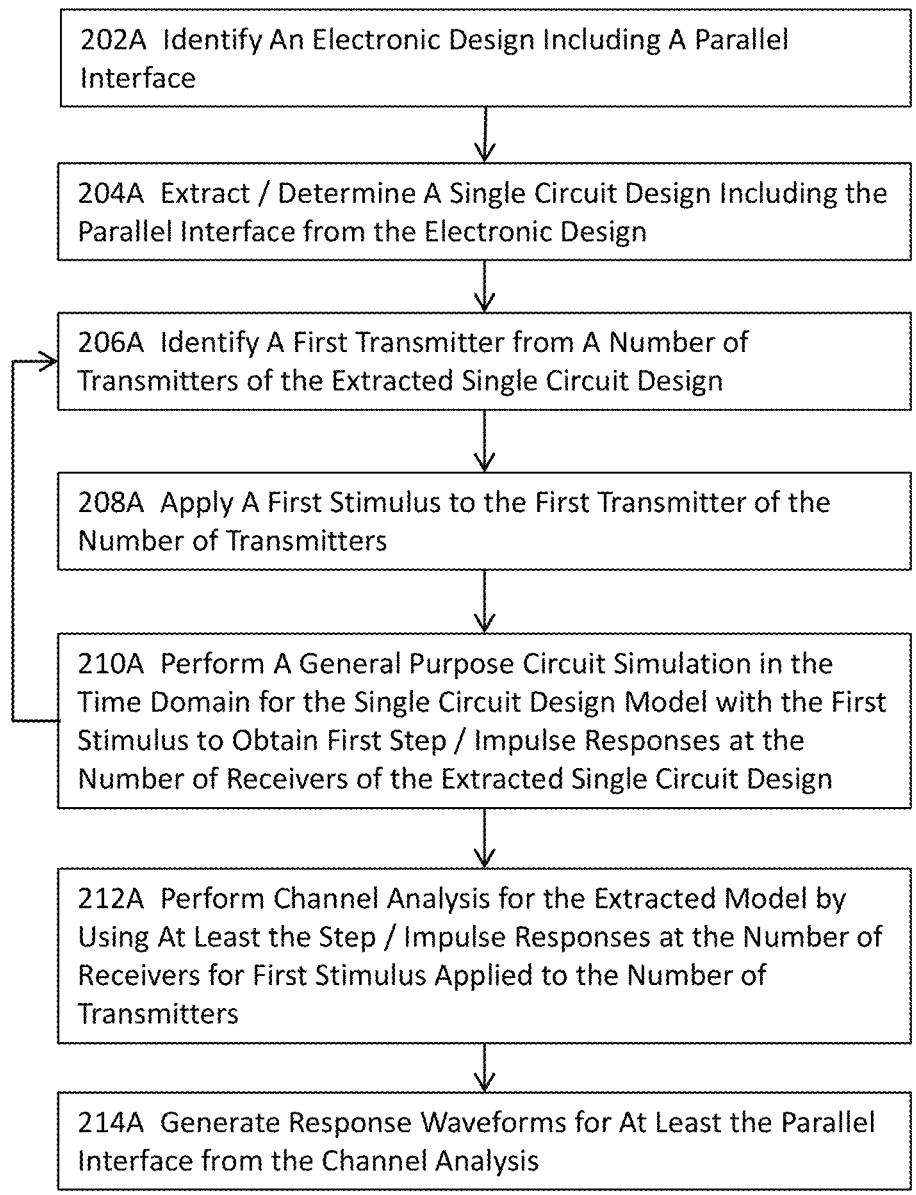
FIG. 2A illustrates a more detailed block diagram for characterizing an electronic system design including a parallel interface and analyzing the characterized the electronic system design by using channel analysis techniques in some embodiments.

FIG. 2A illustrates a more detailed block diagram for analyzing an electronic system design including at least one parallel interface using channel analysis techniques in some embodiments. In these embodiments illustrated in FIG. 2A, the method or system may identify an electronic design including at least one parallel interface at 202A. In some of these embodiments, the electronic design may also include one or more serial interfaces, other devices, or components communicably or operatively coupled to the at least one parallel interface. At 204A, the method or system may extract or determine a single circuit model including the parallel interface from the electronic design. The single circuit of the electronic design may be extracted or determined at various abstraction levels.

For example, the electronic design extracted or determined at 204A may include an IBIS or iBIS-AMI model including various models provided by, for example, one or more intellectual property vendors or a circuit model that may be used as an input to one or more circuit design characterization modules (e.g., the one or more interface characterization modules 106) in some embodiments. In some embodiments, the single circuit model may even include an IBIS-AMI (Input/put buffer information specification-algorithmic modeling interface) model for serialization and deserialization (SerDes) channel simulations or time-domain channel simulations with a SerDes channel simulator, instead of a SPICE or SPICE-like simulator.

For example, if the single circuit design extracted at 204A is to be used in a general circuit simulator such as a SPICE or a SPICE-like simulator for characterization purposes, the single circuit design model may further include a netlist of the electronic design or a portion thereof that may be used by the simulator for characterizations. As another example, the single circuit design model may include an IBIS-AMI model that may be used in a SerDes channel simulator to determine time-domain signal integrity analyses, time-domain channel simulations, and/or timing analyses. The single circuit design model may also include one or more ground planes and/or one or more power planes of the electronic design in some embodiments. In these embodiments, the method or system may further analyze the electronic design while accounting for the ground bounce and/or power bounce effects.

The method or system may characterize the extracted single circuit design by perform the acts including those described in reference numerals 206A and 208A in some embodiments. In some embodiments where the electronic design includes other devices or components that may be communicably or operatively coupled or operatively coupled to the parallel interface, the method or system may also extract or determine the single circuit design model that further includes such other devices or components. For example, the electronic design may comprise a serial interface (e.g., a PCIe interface) that is communicably or operatively coupled to the parallel interface. In this example, the method or system may also extract or determine the single circuit design model to include the serial interface and one or more interconnecting devices or interconnects.

Figure 5:
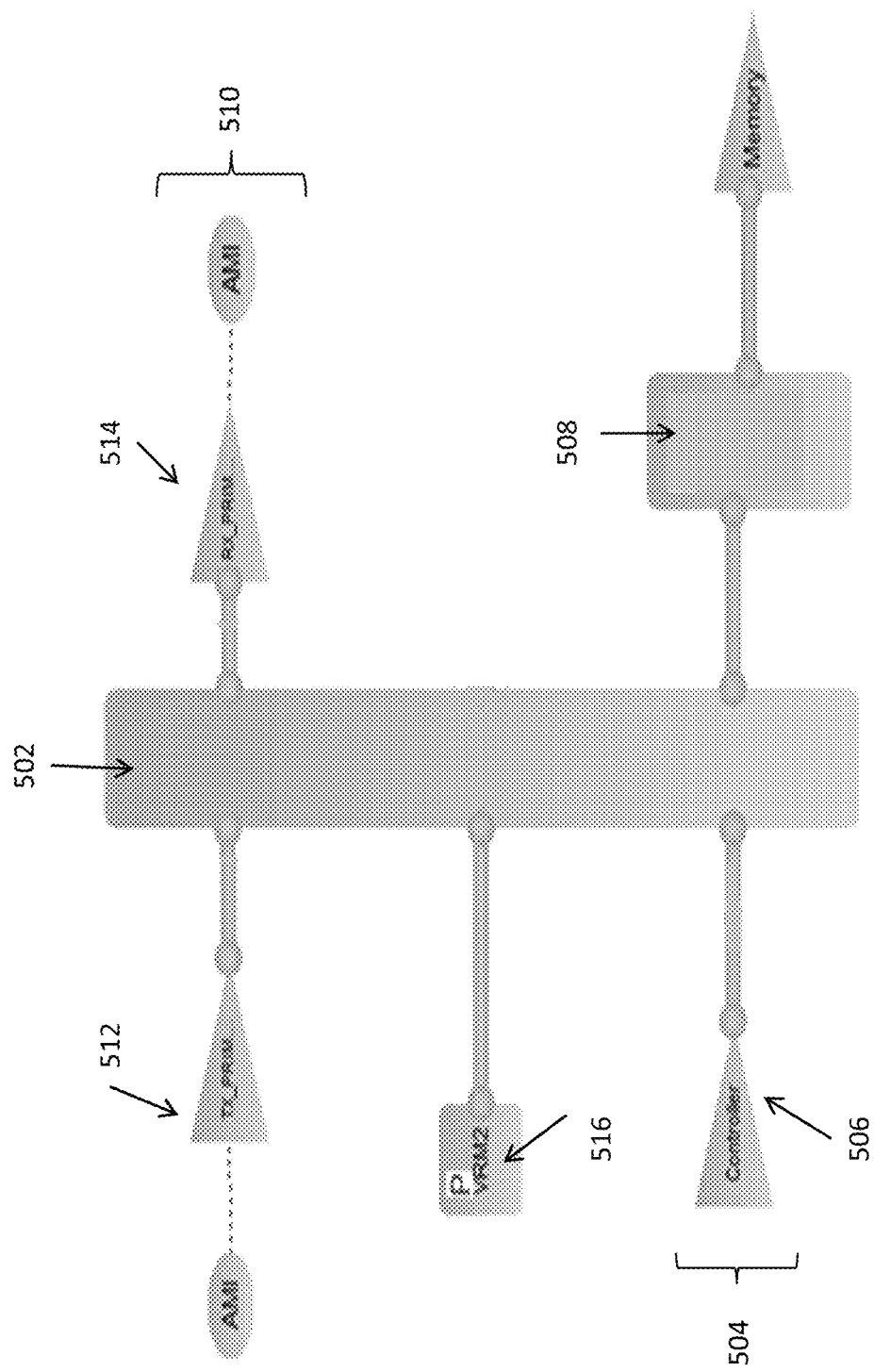
FIG. 5 illustrates a simplified single circuit design representation of an electronic design in some embodiments.

For example, FIG. 5 illustrates a simplified schematic illustration of a single circuit model of an electronic design including the channel interface 502 that is operatively or communicably coupled to a parallel lane 504 including the controller 506 and some DIMMs (dual in-line memory module) 508 and some interconnections therefor. The extracted single circuit model illustrated in FIG. 5 may further include a serial lane 510A further including one or more transmitters 512, one or more receivers 514, and one or more interconnections therefor as well as one or more voltage regulator modules 516. The method or system may extract or determine the single circuit design model at 204A by including these communicably or operatively coupled devices or components as illustrated in FIG. 5 in some embodiments.

In some of these illustrated embodiments, the method or system may identify a first transmitter from a number of transmitters of the parallel interface at 206A and apply a first stimulus to the first transmitter of the number of transmitters. The first stimulus may comprise a step input or an impulse input in some of these embodiments, and the method or system is to use the first stimulus to characterize the responses of the parallel interface at a number of receivers of the parallel interface to the first stimulus. It shall be noted that the number of transmitters (or receivers) may include all of the transmitters (or receivers) of the parallel interface in some embodiments or a subset of all of the transmitters (or receivers) of the parallel interface in some other embodiments. It shall also be noted that although a first transmitter may correspond to a first receiver in the parallel interface, the method or system is to characterize the parallel interface by examining the responses at more than just the corresponding receiver of the first transmitter in these embodiments.

In these embodiments, the corresponding receiver will exhibit the dominant signal response to the first transmitter, while the other receivers will exhibit the coupling effects of the first stimulus from the first transmitter. The method or system may then perform a general purpose circuit simulation in the time domain for the single circuit design model with the first stimulus as an input to obtain first step responses or first impulse responses at the number of receivers of the single circuit design model at 210A. The step response may include the waveform in the time domain in response to the first stimulus comprising a step input. The impulse response may include the waveform in the time domain in response to the first stimulus comprising an impulse input. These step or impulse responses may then be stored as the characterization results.

The method or system may perform channel analysis or channel simulation, which is used interchangeably with "channel analysis" in this application. The method or system may then return to 206A to identify another transmitter of the number of transmitters of the parallel interface and repeat the processes of 206A-210A until the number of transmitters have been similarly processed. The channel analysis may include the processes of 212A and 214A. At 212A, the method or system may perform channel analysis for the extracted single circuit design model by using at least the step or impulse responses at the number of receivers of the single circuit design model for the first stimulus applied to the number of transmitters. In some of these embodiments, the method or system may convolve the step or impulse responses with an input bit stream with respect to the number of transmitters and the number of receivers to determine the response waveform for the single circuit design model.

Convolution includes the application of mathematical operations on, for example, the input bit stream and the step or impulse responses at the number of receivers and constitutes a well-known mathematical technique. At 214A, the method or system may generate the response waveforms for at least the parallel interface in the single circuit design from the channel analysis results. In these embodiments illustrated in FIG. 2A, the method or system needs not perform any general circuit simulation in order to perform the channel analysis for the interface. Rather, the method or system use the convolution techniques to determine the response waveforms of the single circuit design model in response to the input signal (e.g., the input bit stream) to determine the waveforms of the response of the single circuit design model to the input signal.

Figure 2B:
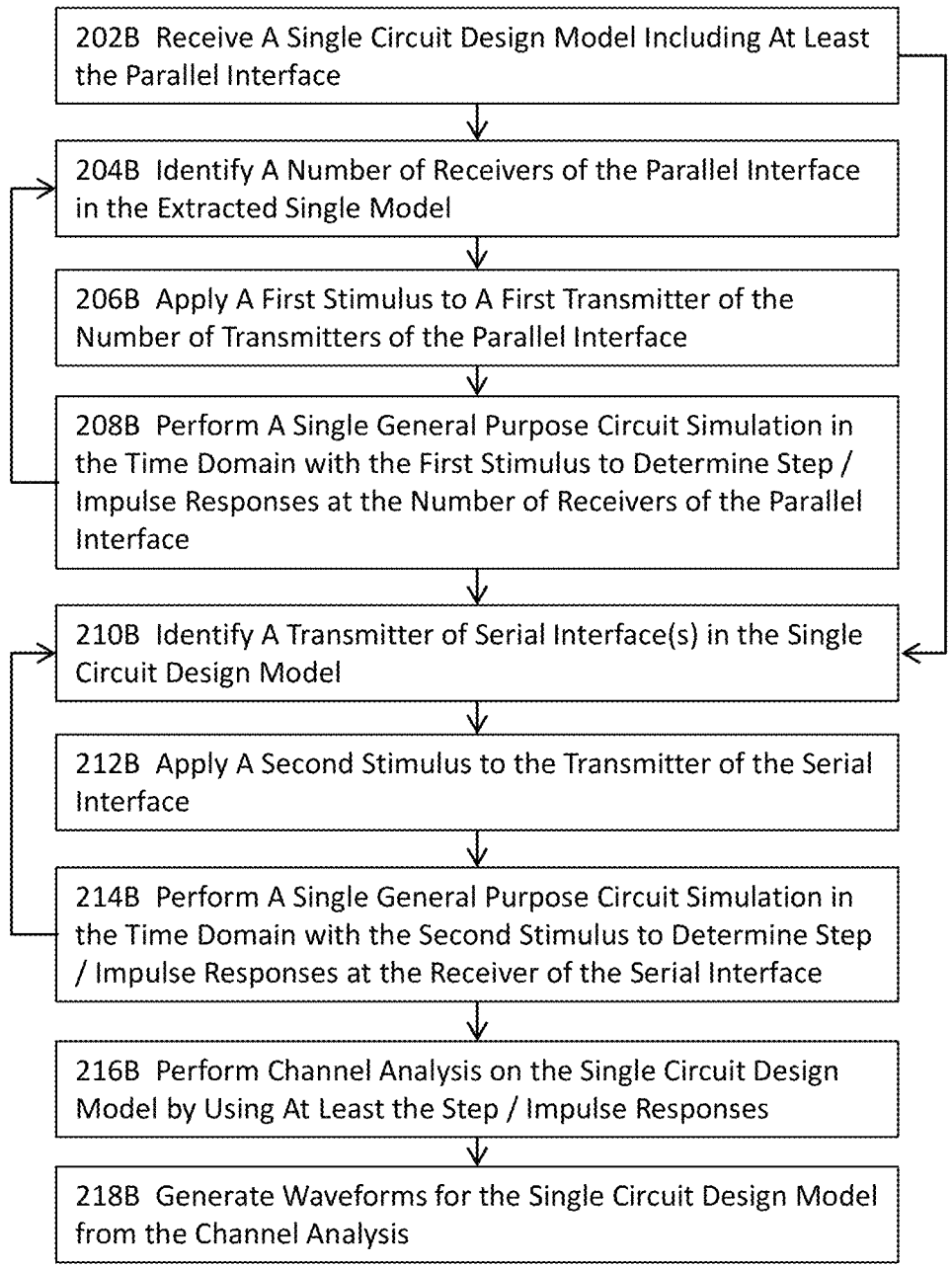
FIG. 2B illustrates another more detailed block diagram for characterizing an electronic system design including a parallel interface and analyzing the characterized the electronic system design by using channel analysis techniques in some embodiments.

FIG. 2B illustrates another more detailed block diagram for analyzing an electronic system design including at least one parallel interface using channel analysis techniques in some embodiments. In these embodiments illustrated in FIG. 2B, the method or system may receive a single circuit design model that includes at least one parallel interface at 202B. The single circuit of the electronic design may be extracted or determined at various abstraction levels. For example, the electronic design extracted or determined may include an IBIS or IBIS-AMI model including various models provided by, for example, one or more intellectual property vendors, or a circuit model that may be used as an input to one or more circuit design characterization modules (e.g., the one or more interface characterization modules 106) in some embodiments.

The single circuit design model may also include an S-parameter model describing the electrical or functional behavior of an electronic device when undergoing various stimuli by electrical signals. The method or system may identify a number of receivers of the parallel interface in the single circuit design model at 204B. It shall be noted that the number of receivers (or transmitters) may include all of the receivers (or transmitters) of the parallel interface in some embodiments or a subset of all of the transmitters (or receivers) of the parallel interface in some other embodiments. In some embodiments where the single circuit design model also includes one or more serial interfaces, the method or system may also identify a receiver from the one or more serial interfaces.

At 206B, a first stimulus may be applied to a first transmitter of the number of transmitters of the parallel interface. It shall also be noted that although a first transmitter may correspond to a first receiver in the parallel interface, the method or system is to characterize the parallel interface by examining the responses at more than just the corresponding receiver of the first transmitter in these embodiments. In these embodiments, the corresponding receiver will exhibit the dominant signal response to the first transmitter, while the other receivers will exhibit the coupling effects of the first stimulus from the first transmitter. In these embodiments, the first stimulus is applied to a transmitter of the parallel interface, and the method or system performs the characterization process to determine the responses to the first stimulus at each of the number of receivers. In some of these embodiments, the first stimulus may include a step input stimulus or an impulse input stimulus.

At 208B, the method or system perform may determine the responses at each receiver of the number of receivers of the In some embodiments, the responses at the receivers may be determined by performing a single general purpose electrical circuit simulation on at least a portion of the single circuit design model including the parallel interface in the time domain with the first stimulus. For example, the method or system may perform a SPICE or SPICE-like simulation or a channel simulation with the step or impulse input on at least a portion of the single circuit design model including the parallel interface to determine the responses at the receivers in some embodiments. In some embodiments where the single circuit design model includes one or more serial interfaces, the method or system may further identify a transmitter of a serial interface in the single circuit design model at 210B and apply a second stimulus to the identified transmitter at 212B.

At 214B, the method or system perform may determine the responses at each receiver of the number of receivers of the In some embodiments, the responses at the receivers may be determined by performing a single general purpose electrical circuit simulation on at least a portion of the single circuit design model including the parallel interface in the time domain with the first stimulus. For example, the method or system may perform a SPICE or SPICE-like simulation (with a SPICE or SPICE-like simulator) or a channel simulation (with a SerDes simulator) with the step or impulse input on at least a portion of the single circuit design model including the parallel interface to determine the responses at the receivers in some embodiments. The method or system may return to 210B to identify another transmitter of another serial interface, if existing.

It shall be noted that the method or system may characterize the serial interface and the parallel interface either sequentially or simultaneously by using the same session or different sessions. Therefore, the process or method may proceed to 210B either directly from 202B or from 208B as illustrated in FIG. 2B. In addition, FIG. 2B illustrates the characterization of the parallel interface before the serial interface when the method or system proceeds to 210B from 208B. Nonetheless, the serial interface may be characterized before the parallel interface is characterized, if these interfaces are characterized sequentially. At 216B, the method or system may perform channel analysis on the single circuit design model by using at least the step or impulse responses captured at 208B and 214B.

At 218B, the method or system may generate the waveforms for the response of the single circuit design model from the channel analysis. In some of these illustrated embodiments, the method or system may perform the channel analysis by performing convolution for the step or impulse responses captured at the receivers of the parallel interface and/or the one or more serial interfaces with the respective input data (e.g., input bit streams) for the parallel interface and/or the one or more serial interfaces.

Figure 2C:
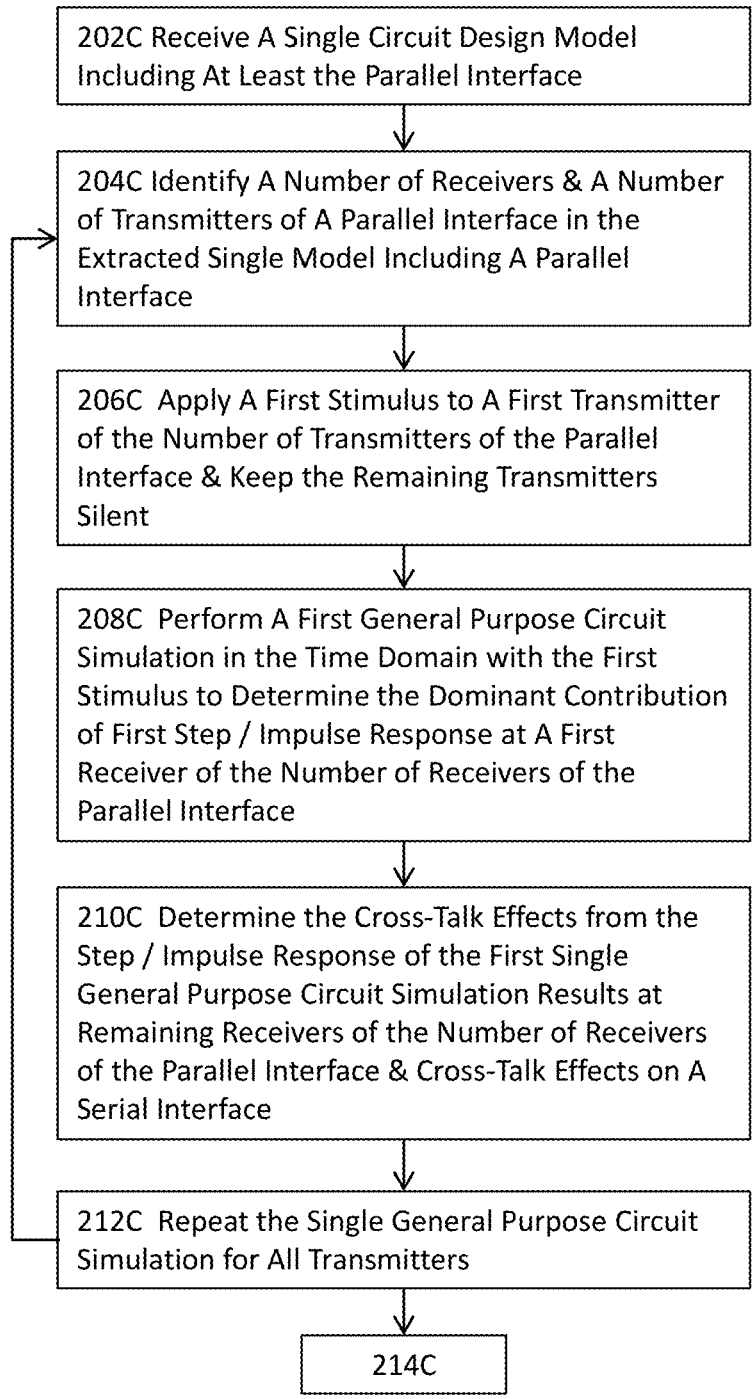
FIGS. 2C-D jointly illustrate another more detailed block diagram for characterizing an electronic system design including a parallel interface and analyzing the characterized the electronic system design by using channel analysis techniques in some embodiments.
Figure 2D:
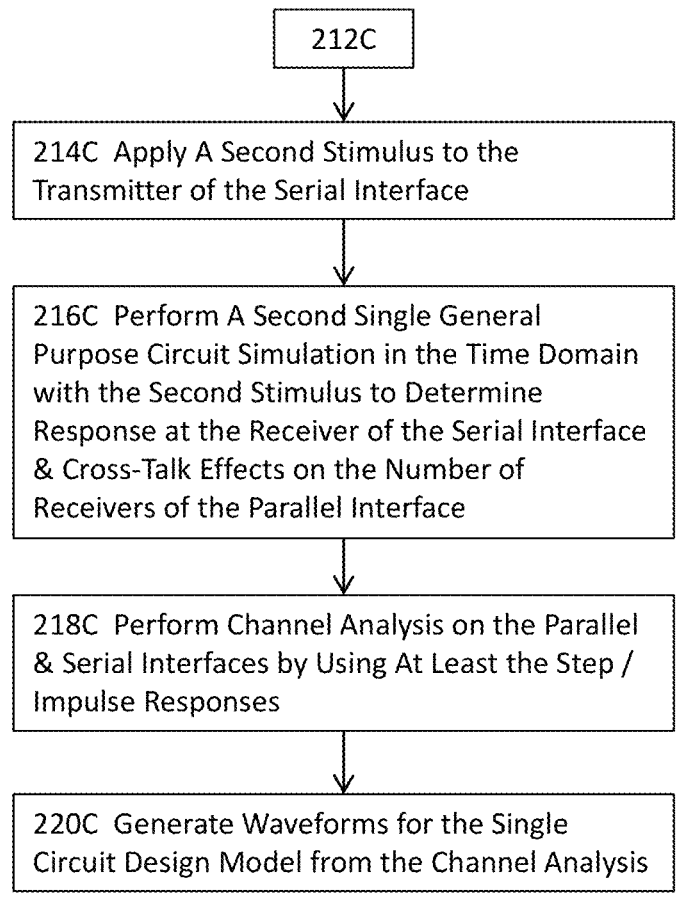

FIGS. 2C-D jointly illustrate another more detailed block diagram for characterizing an electronic system design including a parallel interface and analyzing the characterized the electronic system design by using channel analysis techniques in some embodiments. In these embodiments illustrated in FIGS. 2C-D, the method or system may identify a parallel interface including a number of receivers and a number of transmitters at 204C. In some of these embodiments, the method or system may identify the parallel interface from an electronic design such as the single circuit model identified or determined at 204 of FIG. 2. At 206C, the method or system may apply a first stimulus to a first transmitter of the number of transmitters of the parallel interface while keeping the remaining transmitters of the parallel interface silent. The first stimulus may include a step input in some embodiments or an impulse input in some other embodiments. In these embodiments illustrated in FIGS. 2C-D, the method or system applies a stimulus to one of the number of transmitters and keep the remaining transmitters of the parallel interface silent.

At 208C, the method or system may perform a first general purpose circuit simulation in the time domain with the first stimulus applied to the first transmitter. The method or system may use the simulation results to determine the dominant contribution of the first stimulus at the first receiver that corresponds to and receives the signal transmitted from the first transmitter in the parallel interface. The method or system may also use the general purpose simulation results to determine the cross-talk effects of the first stimulus on the remaining receivers of the parallel interface at 210C. In these embodiments, each receiver corresponds to and receives the transmitted signals from its corresponding transmitter. The response at the receiver to the input stimulus (e.g., an impulse response to an impulse input stimulus or a step response to a step input stimulus) applied to its corresponding transmitter is considered as the dominant contribution of the input stimulus. The responses at the remaining receivers that do not correspond to the specific transmitter to which the input stimulus is applied are considered as the cross-talk effects exerted by the transmitter-receiver pair on the traces connecting the remaining receivers to their respective transmitters.

At 212C, the method or system may return to 204C and repeat the acts 204C through 212C for all transmitter of the parallel interface. In these embodiments illustrated in FIGS. 2C-D, the method or system characterizes a parallel interface including a first number of transmitters and a first number of receivers by applying a stimulus (e.g., an impulse or step input) to one transmitter at a time while keeping the remaining transmitters silent and performing a general purpose circuit simulation to determine the dominant contribution and cross-talk effects at the number of receivers in response to the applied stimulus. The method or system then repeats the same process for each of the remaining transmitters to determine the dominant contributions and cross-talk effects of the responses to the input stimuli applied to each of the number of transmitters.

In these embodiments illustrated in FIGS. 2C-D, the method or system may thus perform N general circuit simulations for a parallel interface having N transmitters. Each of the N general circuit simulations generates M responses (e.g., impulse response or step response to the input stimulus) for the parallel interface having M receivers. In these illustrated embodiments, the general purpose circuit simulation determines a waveform response at the number of receivers (e.g., bus receiver modules) in response to the step or impulse input stimulus applied at a transmitter and may be performed on a general purpose circuit simulator such as a SPICE simulator, a SPICE-like simulator, a SerDes simulator, or other similar general purpose circuit simulator.

At 214C, the method or system may characterize a serial interface by applying a second stimulus to the transmitter of the serial interface in the single circuit design model that now includes the parallel interface as well as the serial interface in some of these illustrated embodiments. At 216C, the method or system may perform a second general purpose circuit simulation with the second stimulus to determine the response at the receiver of the serial interface. In some of these embodiments, the method or system may further determine the cross-talk effects of the first input stimulus applied to a transmitter of the parallel interface on the receiver of the serial interface. In addition or in the alternative, the method or system may further determine the cross-talk effects of the second input stimulus applied to the transmitter of the serial interface on the number of receivers of the parallel interface. In these embodiments, the method or system may thus characterize either or both the parallel interface and the serial interface to determine the responses to the input stimuli. The method or system may thus determine the effects (e.g., the simultaneous switching noise) of the parallel interface on the serial interface and vice versa.

At 218C, the method or system may perform channel analysis on the parallel interface by using at least the responses at the number of receivers to the input stimuli individually applied to each of the number of transmitters of the parallel interface. In some of these embodiments, the method or system may further perform the channel analysis on the circuit design model including both the parallel and the serial interface. The method or system may then generate waveforms for the circuit design model in response to input signals from the channel analysis at 220C. In some of these embodiments illustrated in FIGS. 2C-D, the method or system generate the responses in the form of time-dependent waveforms to the input signals by using channel analysis techniques, without using any time-stepping or domain discretizing numerical techniques such as the conventional finite element or finite difference techniques or running any circuit simulations (e.g., SPICE or SPICE-like simulations with a SPICE or SPICE-like simulator or channel simulations with a SerDes simulator) to determine the waveform responses to the input signals for the circuit design model. In addition or in the alternative, the method or system performs the channel analysis for the circuit design model by using channel analysis techniques including a process for convolving the responses obtained via general purpose simulations with the input signals (e.g., input bit stream) to determine the waveform responses to the input signals for the circuit design model, without perform any circuit simulations or conventional time-stepping or domain discretizing numerical techniques.

In some of these embodiments illustrated in FIGS. 2C-D, the method or system applies an input stimulus to each of a number of transmitters of at least one parallel interface, determines the responses to the input stimulus at each of a number of receivers by performing a circuit simulation in a time domain on a general purpose circuit simulator, and determines the waveform responses of the at least one parallel interface with respect to input signals by using channel analysis techniques, without performing circuit simulations or conventional time-stepping or domain discretizing simulations. In these embodiments, the method or system may analyze a parallel interface by characterizing the parallel interface to determine the responses to input stimuli at the receivers of the parallel interface and further by determining the waveform responses of the parallel interface by performing channel analysis, rather than performing general purpose circuit simulations or conventional time-stepping or domain discretizing simulation to obtain the waveform response of the parallel interface.

In addition or in the alternative, the method or system applies an input stimulus to each of a number of transmitters of a circuit design model including at least one parallel interface and one serial interface, determines the responses to the input stimulus at each of a number of receivers of the parallel interface and the receiver of the serial interface by performing a circuit simulation in a time domain on a general purpose circuit simulator, and determines the waveform responses of the circuit design model with respect to input signals by using channel analysis techniques on the responses to the input stimulus at the receivers of the parallel interface and the serial interface, without performing circuit simulations or conventional time-stepping or domain discretizing simulations. In these embodiments, the method or system may analyze the interactions such as the simultaneous switching noise, the intersymbol interferences, etc. between the parallel interface and the serial interface by characterizing the parallel and serial interfaces to determine their responses to input stimuli and determining the waveform responses of the circuit design model by channel analysis without performing simulations to obtain the waveform responses to input signals for the circuit design model including the parallel and serial interfaces.

Figure 3:
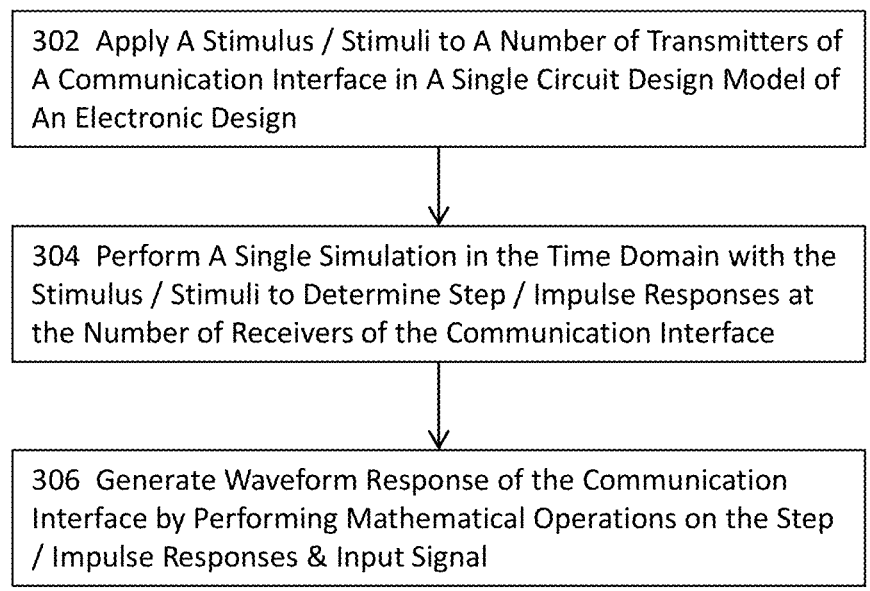
FIG. 3 illustrates a high level block diagram for performing channel analyses for a communication interface of an electronic system in some embodiments.

FIG. 3 illustrates a high level block diagram for performing channel analyses for a communication interface of an electronic system in some embodiments. In these embodiments illustrated in FIG. 3, the method or system may characterize the communication interface by first applying one or more stimuli to a number of transmitters of a communication interface in a single model of an electronic design at 302. In some of these illustrated embodiments, the method or system may apply the same stimulus to each transmitter of the number of transmitters in the single circuit design model. The single circuit model of the electronic design may be extracted or determined at various abstraction levels.

For example, the single circuit model may include an IBIS model or an IBIS-AMI model including various models provided by, for example, one or more intellectual property vendors in some embodiments. In addition or in the alternative, the single circuit design model may also include an S-parameter model describing the electrical or functional behavior of an electronic device when undergoing various stimuli by electrical signals. In some other embodiments, the single circuit model of the electronic design may also include a design that may be used for input into subsequent modules. For example, a single circuit may include the netlist or a portion thereof of the electronic design that may be used in a subsequent SPICE or SPICE-like simulation module or an IBIS model in a subsequent channel simulation module. As another example, the single circuit design model may include an IBIS-AMI model that may be used in a SerDes channel simulator to determine time-domain signal integrity analyses, time-domain channel simulations, and/or timing analyses.

The one or more stimuli may comprise one or more step inputs, one or more impulse inputs, or any combinations thereof in some of these embodiments, and the method or system is to apply the one or more stimuli to the number of transmitters at the same time to characterize the responses of the communication interface at a number of receivers of the communication interface to the one or more stimuli. It shall be noted that the number of transmitters (or receivers) may include all of the transmitters (or receivers) of the communication interface in some embodiments or a subset of all of the transmitters (or receivers) of the communication interface in some other embodiments.

At 304, the method or system may further characterize the single circuit design model by performing a single simulation in the time domain with the one or more stimuli concurrently applied to the number of transmitters of the communication interface. The method or system may then determine the waveform responses at the number of receivers to the one or more step or impulse stimuli for the single simulation. Once the single circuit design model is characterized, the method or system may generate the waveform responses of the single circuit design model including the communication interface by performing a series of mathematical operations on an input signal and the step or impulse responses at the number of receivers of the communication interface at 306, without having to performing simulations on the single circuit design model. In some embodiments, the method or system generates the waveform responses of the single circuit design model including the communication interface by performing convolution of the step or impulse responses at the number of receivers with the input signal stream, rather than performing any electrical or functional simulations such as SPICE or SPICE-like simulations on the single circuit design model.

A communication interface in these embodiments illustrated in FIG. 3 may include a parallel interface or a serial interface. In other words, these embodiments illustrated in FIGS. 3-3B apply are aimed at performing channel analysis for any computer bus architectures, regardless of whether these computer bus architectures are serial, parallel, or any combinations of serial and parallel buses. Moreover, these embodiments illustrated in FIGS. 3-3B improve the channel analysis by performing a single characterization for the single circuit design model of interest. Moreover, given a communication interface comprising N transmitters and N receivers, another channel analysis methodology (e.g., the channel analysis in FIGS. 2-2B) may need to apply a stimulus to each transmitter of the N transmitters and observe the responses to the applied stimulus at the N receivers by performing, for example, a simulation (e.g., a channel simulation on a SerDes simulator) in some embodiments illustrated in FIGS. 2-2B. In these embodiments, the method or system may thus perform a total of N simulations to fully characterize the communication interface. With the methodologies described in these embodiments illustrated in FIGS. 3-3B, the method or system may perform a single simulation (e.g., a single channel simulation on a SerDes simulator) to fully characterize the communication interface, regardless of the number of transmitters or the number of receivers of the communication interface.

Figure 3A:
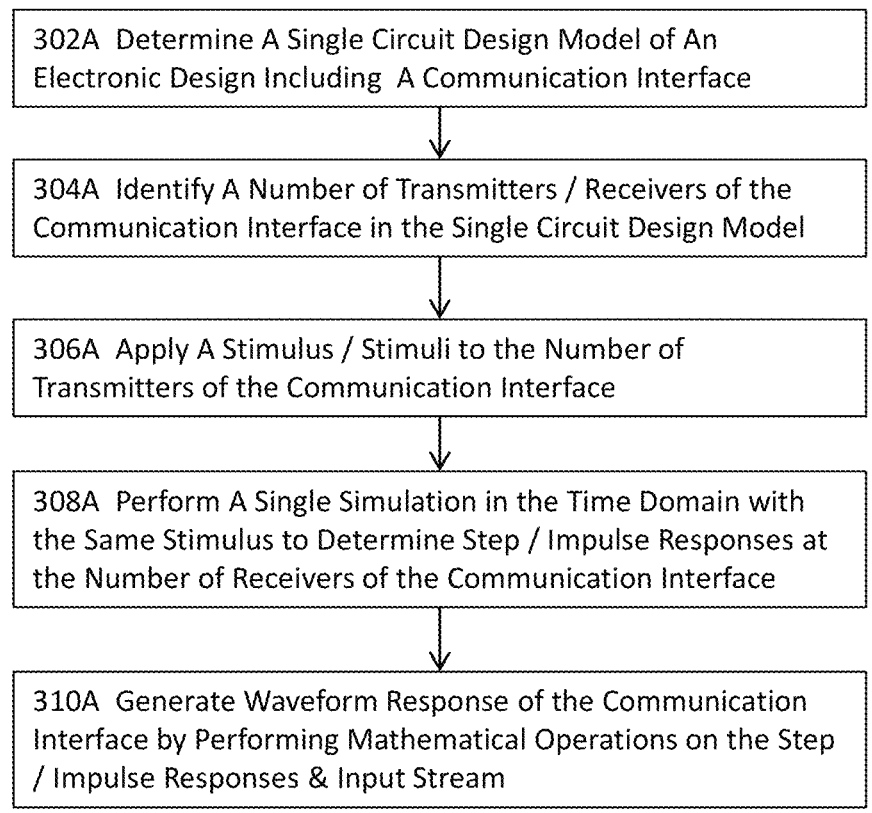
FIG. 3A illustrates a more detailed block diagram for performing channel analyses for an communication interface of an electronic system in some embodiments.

FIG. 3A illustrates a more detailed block diagram for performing channel analyses for an communication interface of an electronic system in some embodiments. In these embodiments illustrated in FIG. 3A, the method or system may determine a single circuit design model of an electronic design including a communication interface at 302A in substantially similar manners as those described in 302 of FIG. 3, 202B of FIG. 2B, 202A of FIG. 2A, or 204 of FIG. 2. The method or system may then identify a number of receivers and/or transmitters of the communication interface in the single circuit design model at 304A and concurrently apply one or more stimuli to the number of transmitters at 306A.

In some of these illustrated embodiments, the method or system may apply the same stimulus to each transmitter of the number of transmitters. In these embodiments, every transmitter receives the same stimulus such as a step input or an impulse input that resembles or simulates switching of a transmitter. At 308A, the method or system may perform a single simulation in the time domain to determine the step or impulse responses at the number of receivers of the communication interface. The single simulation may include, for example, a channel simulation with an IBIS model or an IBIS-AMI model on a channel simulator (e.g., a SerDes simulator) of the electronic design. The determination of the responses at the receivers of the communication interface concludes the characterization of the communication interface.

Once the single circuit design model is characterized, the method or system may generate the waveform responses of the single circuit design model including the communication interface by performing a series of mathematical operations on an input signal and the step or impulse responses at the number of receivers of the communication interface at 310A, without having to performing simulations on the single circuit design model. In some embodiments, the method or system generates the waveform responses of the single circuit design model including the communication interface by performing convolution of the step or impulse responses at the number of receivers with the input signal stream, rather than performing any electrical or functional simulations such as SPICE or SPICE-like simulations on the single circuit design model.

Figure 3B:
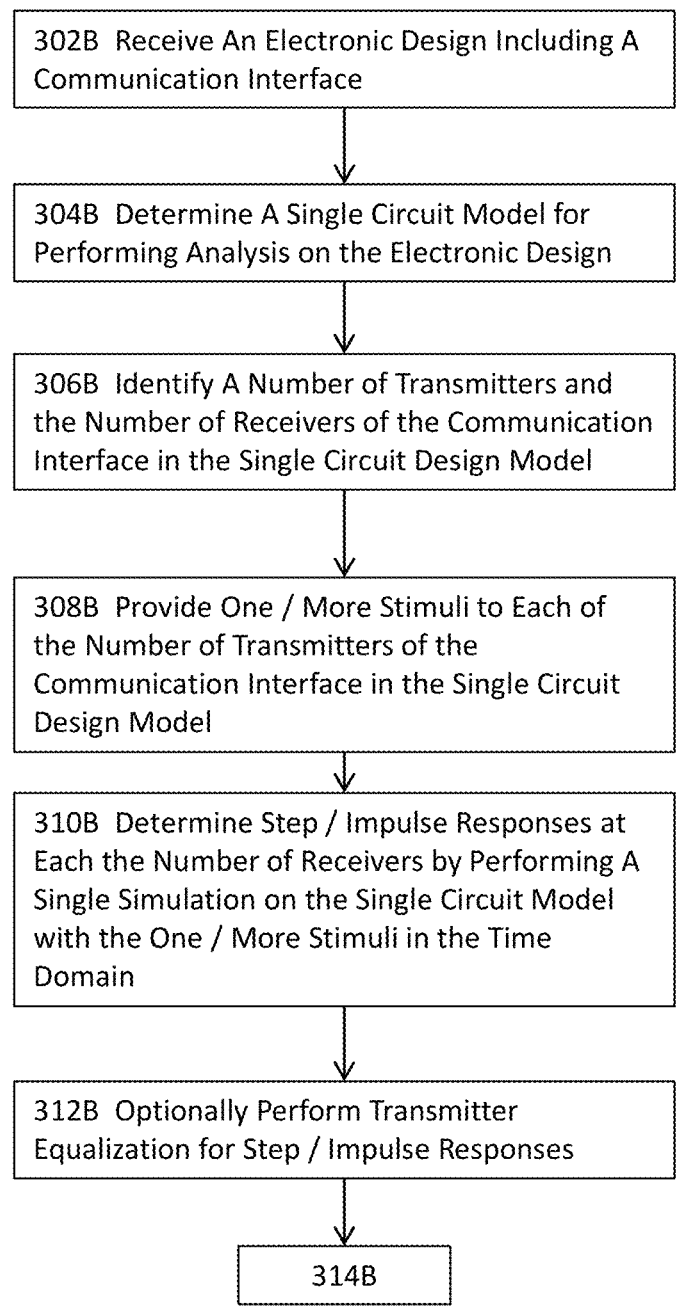
FIGS. 3B-C jointly illustrate another more detailed block diagram for performing channel analyses for an communication interface of an electronic system in some embodiments.

FIG. 3B illustrates another more detailed block diagram for performing channel analyses for an communication interface of an electronic system in some embodiments. In these embodiments illustrated in FIG. 3B, the method or system may receive or identify an electronic design including a communication interface at 302B and determine a single circuit design model for performing one or more analyses for the electronic design at 304B. The single circuit design model may include, for example, an IBIS model, an IBIS-AMI model, an S-parameter model, or any other models that are suitable for characterizing the receivers of the communication interface in response to one or more input stimuli including a step input stimulus, an impulse input stimulus, or a combination thereof.

At 306B, the method or system may identify a number of transmitters and the number of receivers of the communication interface in the single circuit design model. The number of transmitters may include all the transmitters of the communication interface in some embodiments or a smaller subset of all the transmitters in some other embodiments. At 308B, the method or system may provide one or more stimuli to the number of transmitters of the communication interface in the single circuit design model. In some of these embodiments, the method or system may concurrently apply the same stimulus to each transmitter of the number of transmitters. For example, the method or system may apply the same stimulus such as a step input stimulus or an impulse input stimulus that resembles or simulates switching of a transmitter to each transmitter of the number of transmitters.

At 310B, the method or system may determine the step or impulse responses at each receiver of the number of receivers by performing a single time-domain simulation (e.g., a single channel simulation for the single circuit design model on a SerDes simulator) with the one or more stimuli. The method or system may also optionally perform transmitter equalization on the step or impulse responses at the number of receivers at 312B before the step or impulse responses at these receivers are forwarded to the channel analysis modules to determine the waveform response of the single circuit design model in response to an input signal. For example, the method or system may apply a feed forward equalizer (FFE) to the step or impulse responses of the number of receivers.

Figure 3C:
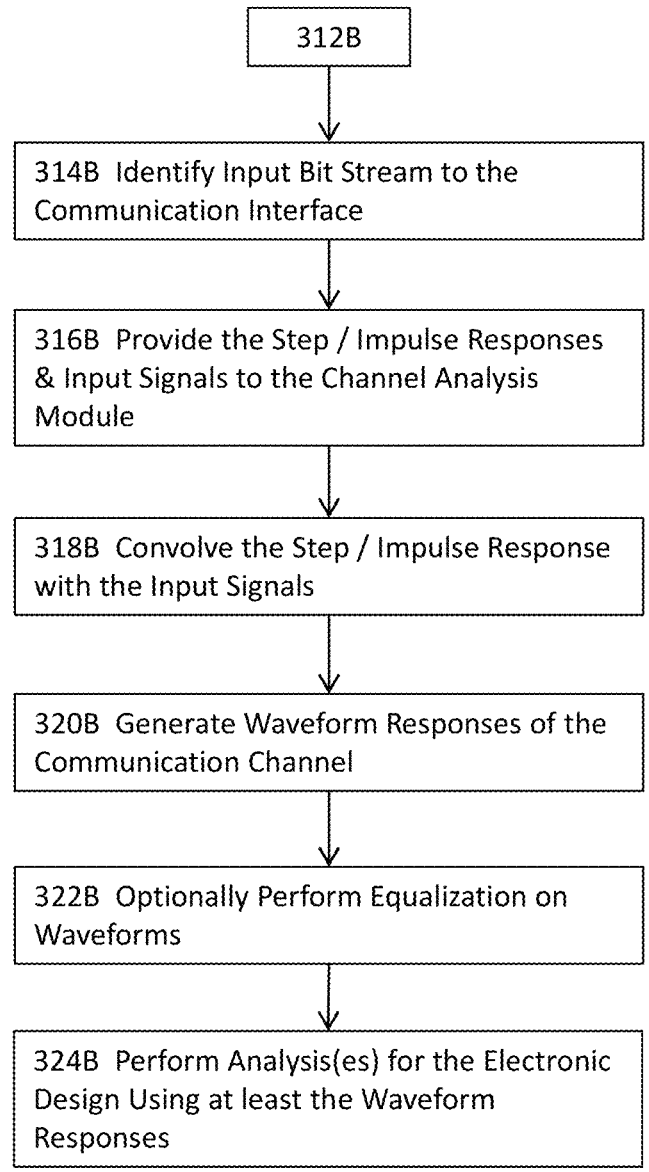

Turning to FIG. 3C, the method or system may identify input signals to the communication interface and/or other input signals to other devices in the single circuit design model at 314B. In some embodiments, the input signals may include an input bit stream of interest. At 316B, the step or impulse responses at the number of receivers and the input signals may be provided to a channel analysis module (e.g., channel analysis module 110 of FIG. 1) which determines the waveform responses of the single circuit design model by performing a series of mathematical operations on the step or impulse responses at the number of receivers and the input signals, without performing any electrical or functional circuit simulations such as SPICE or SPICE-like simulations or other conventional time-stepping or domain discretization simulation techniques such as finite element or finite difference techniques.

At 318B, the method or system may convolve the step or impulse responses at the number of receivers of the communication interface with the input signals to the communication interface. The waveform responses of the single circuit design model may then be generated at 320B by the convolution of the step or impulse responses with the input signals including, for example, an input bit stream. The generated waveform response of the single circuit design model may further be optionally processed with an equalizer at 322B to mitigate signal degradation during transmission for receiver data recovery in some embodiments. The equalizer may include, for example, a continuous-time linear equalizer which provides adaptive equalization with integrated clock and data signals in some embodiments or an analog or digital decision based equalizer (DFE) that may base equalization on the sliced values of the neighboring bits to prevent adding noise from neighboring bits. Decision based equalization may be more desirable in relatively high data rate applications (e.g., gigabit serialization/deserialization applications) that may render digitization of data difficult or impractical. At 324, the method or system may perform one or more analyses for the electronic design using at least the waveform responses of the single circuit design model.

Figure 4:
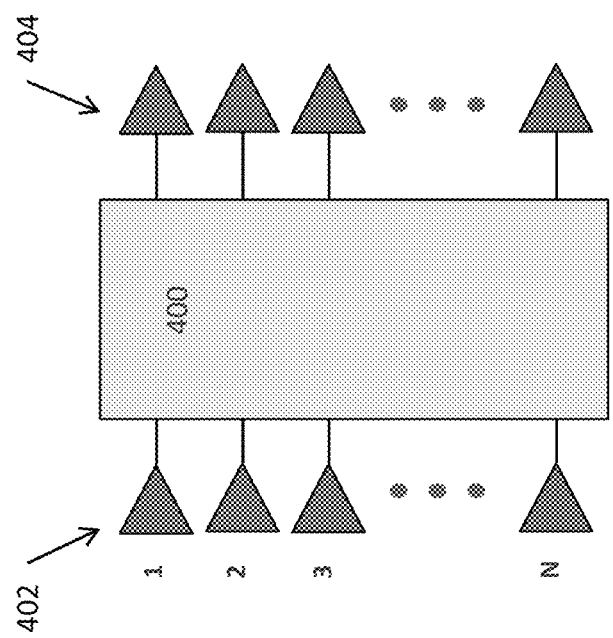
FIG. 4 illustrates a schematic representation of an electronic module having a number of transmitters and the same number of receivers in some embodiments.

FIG. 4 illustrates a simplified schematic representation of an electronic system having a number of transmitters and the same number of receivers in some embodiments. The simplified schematic representation may represent a N-memory system 400 having a total number of N transmitters 402 and a total number of N receivers 404.

Figure 6:
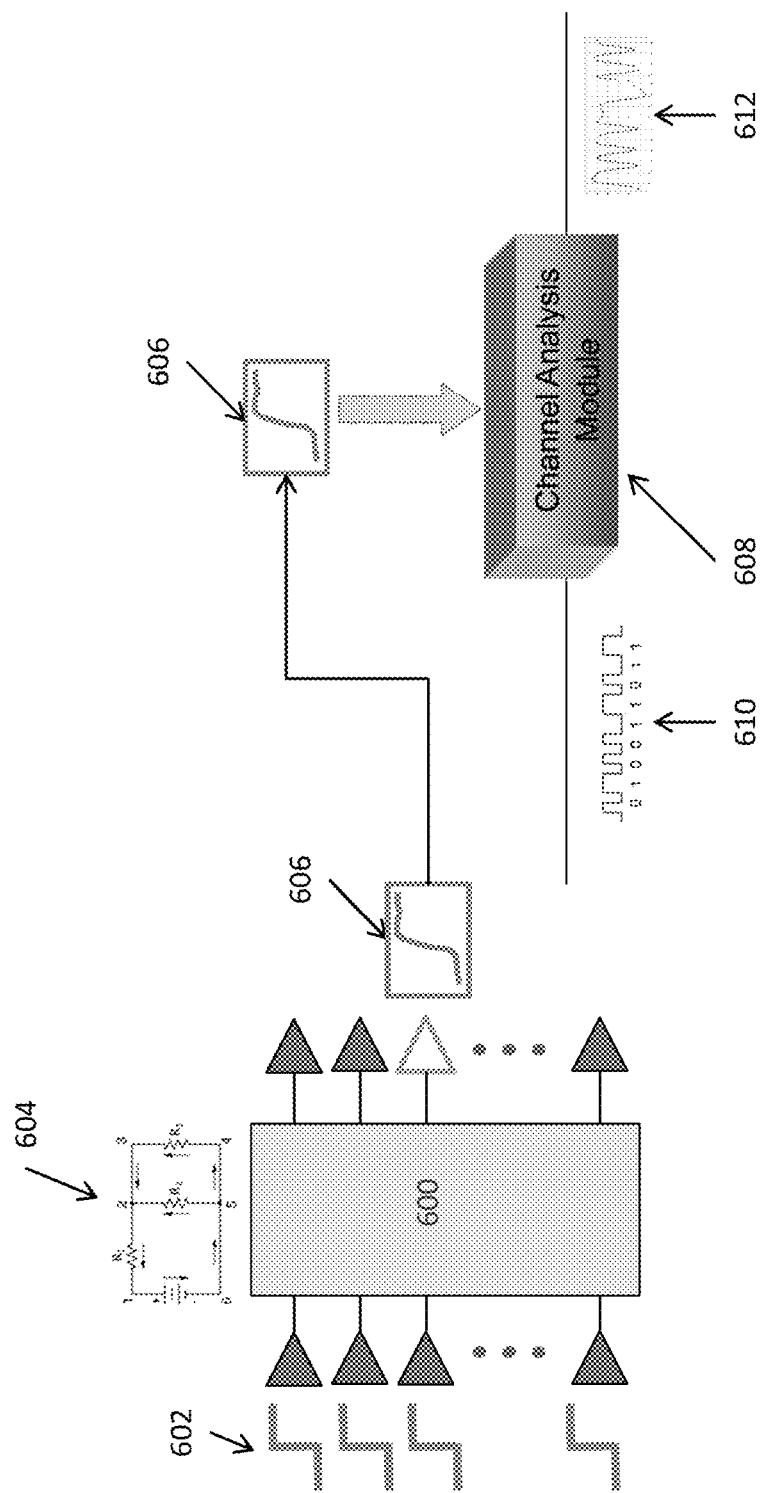
FIG. 6 illustrates a schematic diagram of an illustrative channel analysis flow for a communication interface of an electronic system in some embodiments.

FIG. 6 illustrates a schematic diagram of an illustrative channel analysis flow for a communication interface of an electronic system in some embodiments. More specifically, the illustrative channel analysis flow in FIG. 6 includes the extraction or determination of a single circuit design model 600 (e.g., an IBIS model or an IBIS-AMI model) having a number of transmitters and a number of receivers. The same input stimulus or different input stimuli 602 are applied to the transmitters, either one transmitter at a time or a plurality of transistors concurrently. The single circuit design model 600 may be characterized by determining the response 606 at the number of receivers to the input stimulus or stimuli with, for example, one or more channel simulation on a SerDes simulator. The responses 606 may be forwarded to a channel analysis module 608 which may perform convolution for responses 606 with the input signal stream 610 to produce the waveform response 612 of the single circuit design model 612, without having to perform any electrical or functional circuit simulations (e.g., SPICE or SPICE-like simulations) for the electronic design.

Figure 7:
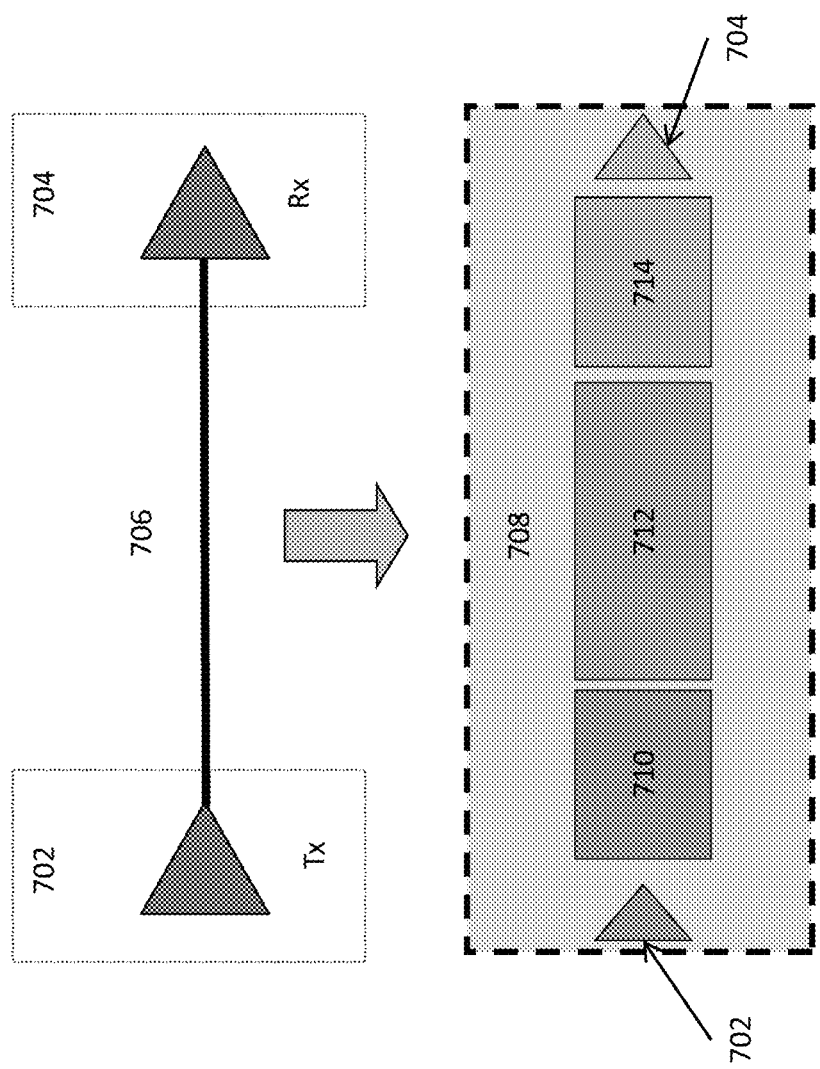
FIG. 7 illustrates a schematic diagram of an interface for transmitter and receiver IBIS models in some embodiments.

FIG. 7 illustrates a schematic diagram of an interface for transmitter and receiver IBIS models in some embodiments. More specifically, FIG. 7 illustrates an approach that separates the channel 706 from the transmitter 702 and the receiver 704 of a channel 708. In these embodiments illustrated in FIG. 7, the interconnect 706, including the system interconnect 712 and the packaging interconnects 710 and 714, that exhibits analog behavior is separated from the transmitter 702 and receiver 704 for characterization of the channel 708 in some embodiments. In some other embodiments where one of the objectives of the channel characterization is to determine the coupling effects, the channel 706 may not be required to be separated from the transmitter 702 and the receiver 704. For example, in some of the embodiments illustrated in FIGS. 2-2B, the method or system may characterize a parallel interface by performing a simulation that applies a stimulus to a transmitter to determine the responses at a number of receivers, while keeping the remaining transmitters of a number of transmitters silent. In these embodiments, the method or system may not separate the channel 706 from the transmitter and the receiver in the simulation.

Figure 8:
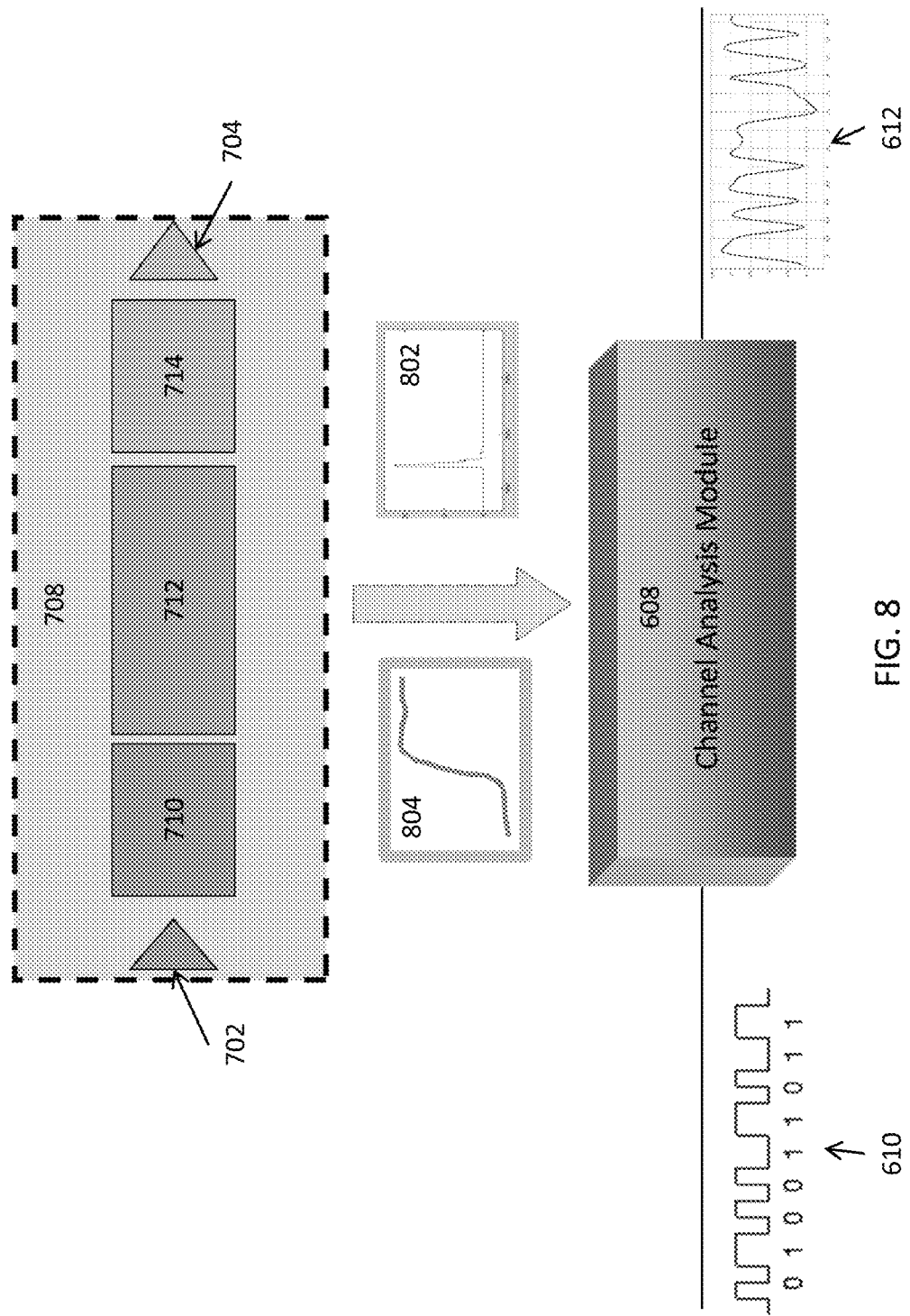
FIG. 8 illustrates a schematic diagram of performing channel analysis with the interface for transmitter and receiver IBIS models in some embodiments.

FIG. 8 illustrates a schematic diagram of performing channel analysis with the interface for transmitter and receiver IBIS models in some embodiments. More specifically, FIG. 8 illustrates the channel simulation In these embodiments illustrated in FIG. 8, the method or system may characterize the communication interface by applying one or more receivers (e.g., one or more of reference numerals 704), applying one or more stimuli to a number of transmitters (e.g., one or more of reference numerals 702) either one at a time (as illustrated in FIGS. 2-2B) or concurrently (as illustrated in FIGS. 3-3B), and determining the step responses 804 or impulse responses 802 at the one or more receivers. The impulse responses 802 or the step responses 804 may be provided to the channel analysis module 608 via a computer bus (e.g., reference numerals 933 and/or 906 of FIG. 9) or a communication channel (e.g., reference numerals 914 and/or 915 of FIG. 9). The channel analysis module 608 may perform convolution for the step responses 804 or the impulse responses 802 with the input data stream 610 to generate the waveform responses 612 of the communication interface or the channel of interest.

System Architecture Overview

Figure 9:
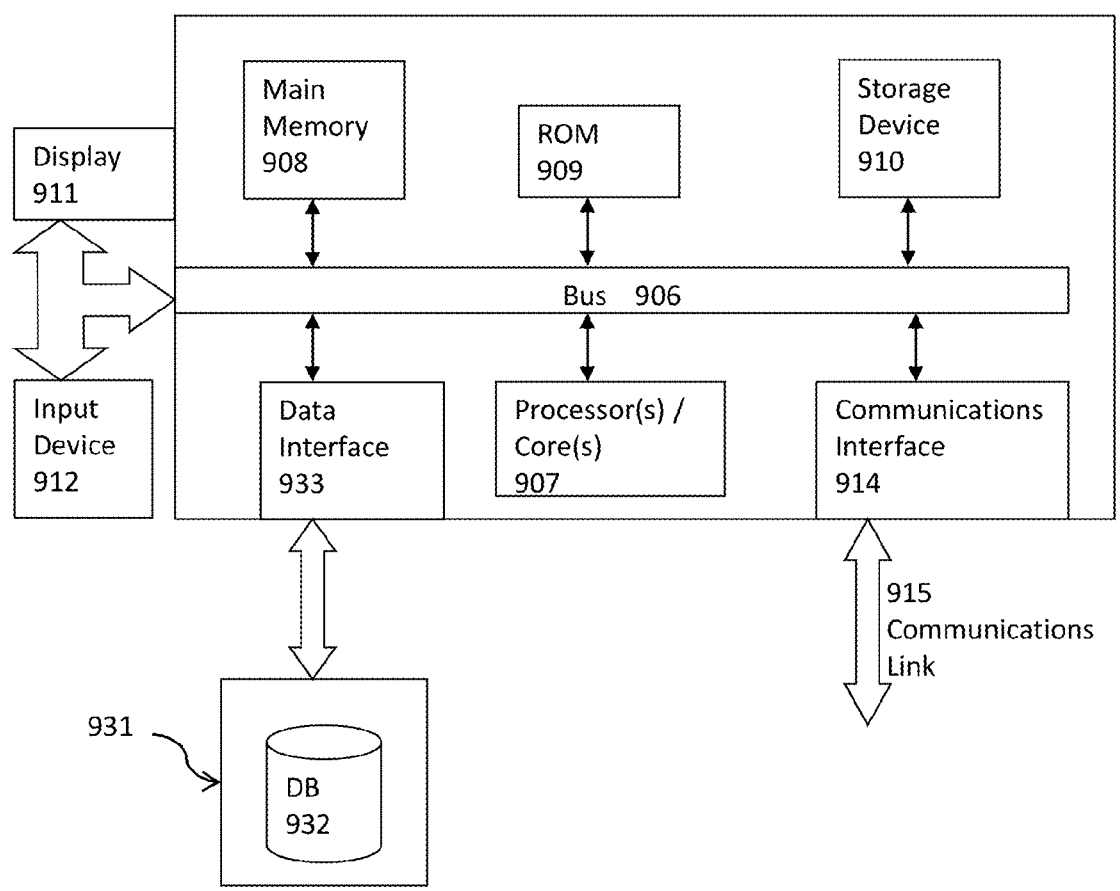
FIG. 9 illustrates a computerized system on which a method for performing channel analyses for an communication interface of an electronic system and a method for characterizing an electronic system design including a parallel interface and analyzing the characterized the electronic system design by using channel analysis techniques may be implemented.

FIG. 9 illustrates a block diagram of an illustrative computing system 900 suitable for analyzing an electronic system design including at least one parallel interface using channel analysis techniques as described in the preceding paragraphs with reference to various figures. Computer system 900 includes a bus 906 or other communication mechanism for communicating information, which interconnects subsystems and devices, such as processor 907, system memory 908 (e.g., RAM), static storage device 909 (e.g., ROM), disk drive 910 (e.g., magnetic or optical), communication interface 914 (e.g., modem or Ethernet card), display 911 (e.g., CRT or LCD), input device 912 (e.g., keyboard), and cursor control (not shown).

According to one embodiment, computer system 900 performs specific operations by one or more processor or processor cores 907 executing one or more sequences of one or more instructions contained in system memory 908. Such instructions may be read into system memory 908 from another computer readable/usable storage medium, such as static storage device 909 or disk drive 910. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 907, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 907 for execution. Such a medium may take many forms, including but not limited to, non-volatile media and volatile media. Non-volatile media includes, for example, optical or magnetic disks, such as disk drive 910. Volatile media includes dynamic memory, such as system memory 908. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 900. According to other embodiments of the invention, two or more computer systems 900 coupled by communication link 915 (e.g., LAN, PTSN, or wireless network) may perform the sequence of instructions required to practice the invention in coordination with one another.

Computer system 900 may transmit and receive messages, data, and instructions, including program, i.e., application code, through communication link 915 and communication interface 914. Received program code may be executed by processor 907 as it is received, and/or stored in disk drive 910, or other non-volatile storage for later execution. In an embodiment, the computer system 900 operates in conjunction with a data storage system 931, e.g., a data storage system 931 that includes a database 932 that is readily accessible by the computer system 900. The computer system 900 communicates with the data storage system 931 through a data interface 933. A data interface 933, which is coupled to the bus 906, transmits and receives electrical, electromagnetic or optical signals that include data streams representing various types of signal information, e.g., instructions, messages and data. In embodiments of the invention, the functions of the data interface 933 may be performed by the communication interface 914.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for characterizing and analyzing an electronic system design including a parallel interface, comprising:
   identifying an electronic design including a design of a parallel interface;
   determining a single circuit representation including the design of the parallel interface from the electronic design; and
   analyzing the single circuit representation including the design of the parallel interface at a channel analysis module stored at least partially in memory and functioning in tandem with at least one processor or processor core of a computing system to determine waveform responses of the parallel interface and a remainder of the single circuit representation by using channel analysis techniques without performing general circuit simulations; and
   generating or modifying the electronic design including the design of the parallel interface based in part or in whole upon results of analyzing the single circuit representation.

2. The computer implemented method of claim 1, the act of analyzing the parallel interface of the single circuit representation comprising:
   characterizing the parallel interface of the single circuit representation to determine a characterized parallel interface; and
   performing a channel analysis on at least the parallel interface by using at least the channel analysis techniques.

3. The computer implemented method of claim 2, the act of characterizing the parallel interface comprising:
   identifying a first transmitter of a number of transmitters of the parallel interface;
   applying a first stimulus to the first transmitter of the number of transmitters while keeping remaining one or more transmitters silent; and
   determining first responses to the first stimulus at a number of receivers of the parallel interface by at least performing one or more channel analyses for the single circuit representation.

4. The computer implemented method of claim 3, the act of characterizing the parallel interface further comprising:
   applying the first stimulus or another stimulus to each transmitter of the remaining one or more transmitters; and
   determining responses to the first stimulus or the another stimulus at the number of receivers of the parallel interface by at least performing the one or more channel analyses for the single circuit representation.

5. The computer implemented method of claim 3, wherein the first stimulus comprises a step input or an impulse input, and the first responses comprise a step response or an impulse response observed at the number of receivers of the parallel interface.

6. The computer implemented method of claim 3, wherein the first responses comprise at least one dominant contribution observed at a receiver corresponding to the first transmitter and cross-talk effects on remaining one or more receivers of the parallel interface.

7. The computer implemented method of claim 2, the act of performing the channel analysis on at least the parallel interface comprising:
   identifying an input signal to the parallel interface of the single circuit representation;
   identifying responses to stimuli at a number of receivers of the characterized parallel interface; and
   determining waveform responses of the parallel interface by convolving the responses observed at the number of receivers in the characterized parallel interface with the input signal, without performing electrical or functional circuit simulations.

8. The computer implemented method of claim 7, wherein the electronic design includes one or more non-linear devices, the input signal comprises an input bit stream, the one or more non-linear devices in the single representation are determined by at least one or more direct current (DC) or DC bias simulations in a time domain to linearize the one or more non-linear devices.

9. The computer implemented method of claim 7, further comprising:
identifying a serial interface in the single circuit representation of the electronic design; and
performing a cross-analysis on the single circuit representation to analyze effects between the parallel interface and the serial interface by using at least the channel analysis techniques.

10. The computer implemented method of claim 7, the act of performing the cross-analysis further comprising:
applying a stimulus on a transmitter of the serial interface;
determining a response of the serial interface to the stimulus by characterizing the serial interface;
determining the effects of the parallel interface on the serial interface by using at least the response.

11. A system for characterizing and analyzing an electronic system design including a parallel interface, comprising:
a processor or a processor core executing one or more threads of execution of a computing system;
non-transitory computer accessible storage medium holding program code that includes a sequence of instructions that, when executed by the processor or processor core, cause the processor or processor core to at least
identify an electronic design including a design of parallel interface;
determine a single circuit representation including the design of parallel interface from the electronic design;
analyze the single circuit representation including the design of the parallel interface at a channel analysis module stored at least partially in memory and functioning in tandem with at least one processor or processor core of a computing system to determine waveform responses of the parallel interface and a remainder of the single circuit representation by using channel analysis techniques without performing general circuit simulations; and
generate or modifying the electronic design including the design of the parallel interface based in part or in whole upon results of analyzing the single circuit representation.

12. The system of claim 11, wherein the non-transitory memory holds the program code, and the program code includes further instructions that, when executed by the processor or processor core, cause the processor or processor core to characterize the parallel interface of the single circuit representation to determine a characterized parallel interface, and perform a channel analysis on at least the parallel interface by using at least the channel analysis techniques.

13. The system of claim 11, wherein the non-transitory memory holds the program code to characterize the parallel interface, and the program code includes further instructions that, when executed by the processor or processor core, cause the processor or processor core to identify a first transmitter of a number of transmitters of the parallel interface, apply a first stimulus to the first transmitter of the number of transmitters while keeping remaining one or more transmitters silent, and determine first responses to the first stimulus at a number of receivers of the parallel interface by at least performing one or more channel analyses for the single circuit representation.

14. The system of claim 11, wherein the non-transitory memory holds the program code to perform the channel analysis on at least the parallel interface, and the program code includes further instructions that, when executed by the processor or processor core, cause the processor or processor core to identify an input signal to the parallel interface of the single circuit representation, identify responses to stimuli at a number of receivers of the characterized parallel interface, and determine waveform responses of the parallel interface by convolving the responses observed at the number of receivers in the characterized parallel interface with the input signal, without performing electrical or functional circuit simulations.

15. An article of manufacture having a non-transitory computer readable storage medium comprising a sequence of instructions which, when executed by at least one processor, causes the at least one processor to execute a set of acts for characterizing and analyzing an electronic system design including a parallel interface, the set of acts comprising:
identifying an electronic design including a design of a parallel interface;
determining a single circuit representation including the design of the parallel interface from the electronic design; and
analyzing the single circuit representation including the design of the parallel interface at a channel analysis module stored at least partially in memory and functioning in tandem with at least one processor or processor core of a computing system to determine waveform responses of the parallel interface and a remainder of the single circuit representation by using channel analysis techniques without performing general circuit simulations; and
generating or modifying the electronic design including the design of the parallel interface based in part or in whole upon results of analyzing the single circuit representation.

16. The article of manufacture of claim 15, the set of acts comprising:
characterizing the parallel interface of the single circuit representation to determine a characterized parallel interface; and
performing a channel analysis on at least the parallel interface by using at least the channel analysis techniques.

17. The article of manufacture of claim 16, the set of acts comprising:
identifying a first transmitter of a number of transmitters of the parallel interface;
applying a first stimulus to the first transmitter of the number of transmitters while keeping remaining one or more transmitters silent; and
determining first responses to the first stimulus at a number of receivers of the parallel interface by at least performing one or more channel analyses for the single circuit representation.

18. The article of manufacture of claim 17, the set of acts comprising:
applying the first stimulus or another stimulus to each transmitter of the remaining one or more transmitters; and
determining responses to the first stimulus or the another stimulus at the number of receivers of the parallel interface by at least performing the one or more channel analyses for the single circuit representation.

19. The article of manufacture of claim 16, the set of acts comprising:
- identifying an input signal to the parallel interface of the single circuit representation;
- identifying responses to stimuli at a number of receivers of the characterized parallel interface; and
- determining waveform responses of the parallel interface by convolving the responses observed at the number of receivers in the characterized parallel interface with the input signal, without performing electrical or functional circuit simulations.

20. The article of manufacture of claim 19, the set of acts comprising:
- identifying a serial interface in the single circuit representation of the electronic design;
- performing a cross-analysis on the single circuit representation to analyze effects between the parallel interface and the serial interface by using at least the channel analysis techniques;
- applying a stimulus on a transmitter of the serial interface;
- determining a response of the serial interface to the stimulus by characterizing the serial interface;
- determining the effects of the parallel interface on the serial interface by using at least the response.

* * * * *